US012777946B2

(12) United States Patent
Chang et al.

(10) Patent No.: US 12,777,946 B2
(45) Date of Patent: Oct. 27, 2026

(54) SEMICONDUCTOR WAFER INCLUDING ALIGNMENT KEY PATTERN LAYER INCLUDING CONTACT PATTERN LAYER DISPOSED THEREON

(71) Applicant: SK hynix Inc., Gyeonggi-do (KR)

(72) Inventors: Heon Yong Chang, Gyeonggi-do (KR); Hyeong Geun Joe, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 637 days.

(21) Appl. No.: 18/194,656

(22) Filed: Apr. 3, 2023

(65) Prior Publication Data

US 2024/0128198 A1 Apr. 18, 2024

(30) Foreign Application Priority Data

Oct. 14, 2022 (KR) ........................ 10-2022-0132755

(51) Int. Cl.

| | |
|---|---|
| ***H10W 46/00*** | (2026.01) |
| ***H10W 70/65*** | (2026.01) |
| ***H10W 70/69*** | (2026.01) |
| ***H10W 90/00*** | (2026.01) |

(52) U.S. Cl.

CPC ........... *H10W 46/00* (2026.01); *H10W 70/65* (2026.01); *H10W 70/69* (2026.01); *H10W 90/701* (2026.01)

(58) Field of Classification Search

CPC ... H10W 70/65; H10W 70/69; H10W 90/701; H10W 46/00; G03F 9/7076; G03F 9/7084

See application file for complete search history.

(56) References Cited

U.S. PATENT DOCUMENTS

| | | | | |
|---|---|---|---|---|
| 10,192,832 | B2 | 1/2019 | Hsiao et al. | |
| 2006/0001144 | A1 * | 1/2006 | Uehling | H01L 23/585 257/690 |
| 2013/0037958 | A1 * | 2/2013 | Ho | H10F 39/026 257/E23.079 |
| 2021/0175133 | A1 | 6/2021 | Choi et al. | |

FOREIGN PATENT DOCUMENTS

| | | | |
|---|---|---|---|
| KR | 10-0568729 | B1 | 4/2006 |
| KR | 10-2007-0109018 | A | 11/2007 |

OTHER PUBLICATIONS

Office Action for Korean Patent Application No. 10-2022-0132755 issued by the Korean Patent Office on Apr. 21, 2026.

* cited by examiner

*Primary Examiner* — Britt Hanley
*Assistant Examiner* — Victor V Barzykin
(74) *Attorney, Agent, or Firm* — IP&T GROUP LLP

(57) ABSTRACT

In an embodiment, a semiconductor wafer includes an alignment key structure disposed over a substrate, a contact pattern layer disposed on the alignment key structure to extend upward of the alignment key structure, and an insulating layer in contact with the alignment key structure and the contact pattern layer over the substrate.

14 Claims, 28 Drawing Sheets

SEMICONDUCTOR WAFER INCLUDING ALIGNMENT KEY PATTERN LAYER INCLUDING CONTACT PATTERN LAYER DISPOSED THEREON

CROSS-REFERENCE TO RELATED APPLICATIONS

The present application claims priority under 35 U.S.C. 119(a) to Korean Application No. 10-2022-0132755, filed on Oct. 14, 2022, which is incorporated herein by reference in its entirety.

BACKGROUND

1. Technical Field

The present disclosure generally relates to semiconductor wafers and, more particularly, to semiconductor wafers including alignment key structures.

2. Related Art

Through a semiconductor integration process, a plurality of semiconductor chip regions may be defined on a semiconductor wafer. The plurality of semiconductor chip regions may be divided from each other by a scribe lane region. The plurality of semiconductor chip regions may be fabricated into a plurality of semiconductor chips by being separated from each other through a wafer sawing process.

Meanwhile, when performing a lithography step of the semiconductor integration process, alignment key patterns are previously formed on the semiconductor wafer in order to align a photomask to a predetermined location over the semiconductor wafer. In general, the alignment key patterns may be formed as patterns of a thin film layer in a process step prior to the lithography step.

SUMMARY

A semiconductor wafer according to one aspect of the present disclosure may include an alignment key structure disposed over a substrate, a contact pattern layer disposed over the alignment key structure to extend upward of the alignment key structure, and an insulating layer in contact with the alignment key structure and the contact pattern layer over the substrate.

A semiconductor wafer according to another aspect of the present disclosure may include an alignment key structure disposed over a substrate, and a stress alleviation structure disposed over the alignment key structure. The stress alleviation structure may include a contact pattern layer extending upward of the alignment key structure over the alignment key structure, and a connection pattern layer covering the contact pattern layer over the alignment key structure.

These and other features and advantages of the present invention may become better understood from the following detailed description of example embodiments of the invention in conjunction with the following figures.

DETAILED DESCRIPTION

Figure 1:
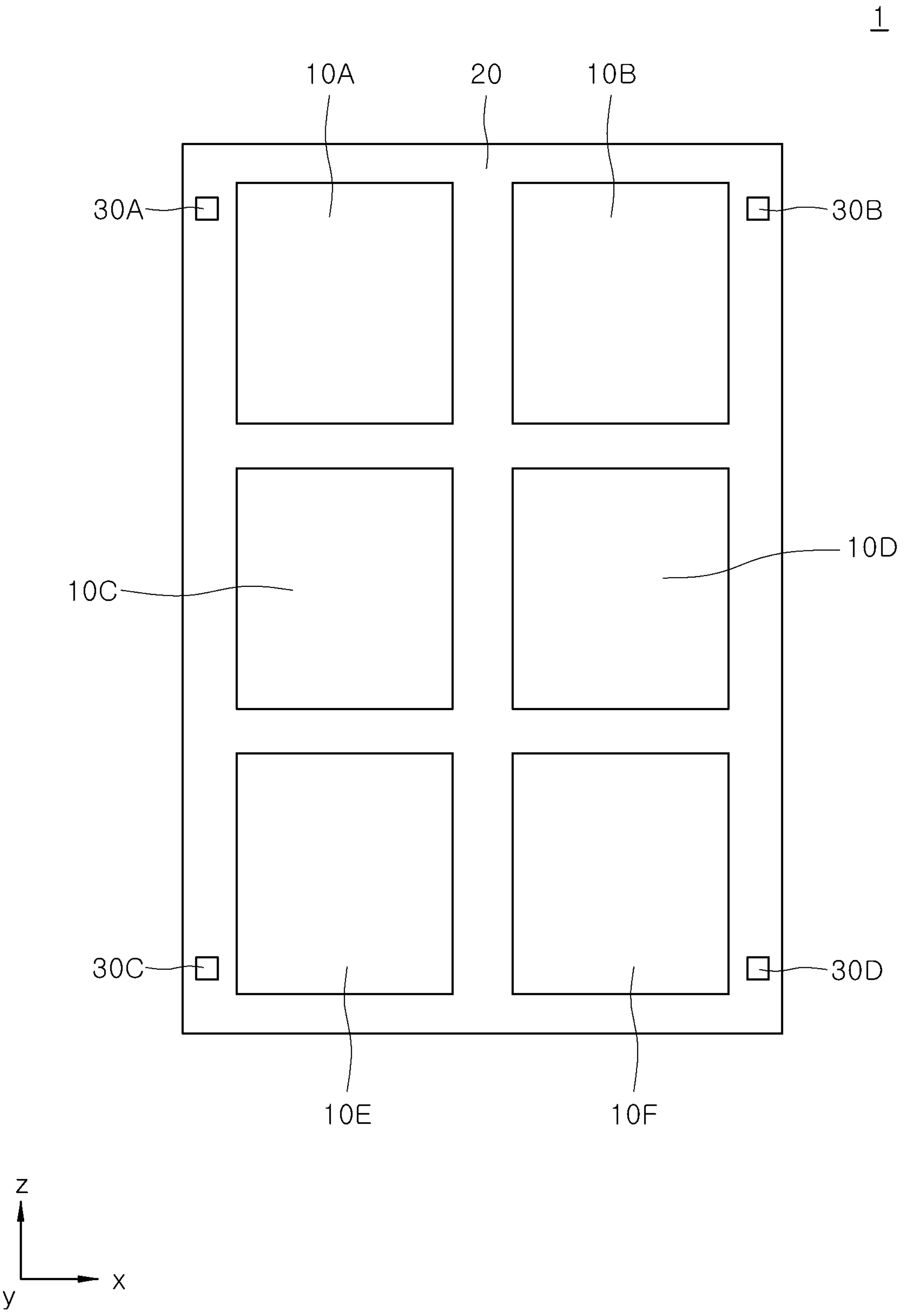
FIG. 1 is a plan view schematically illustrating a semiconductor wafer according to an embodiment of the present disclosure.

Hereinafter, embodiments of the present disclosure will be described in detail with reference to the accompanying drawings. In the drawings, to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition of one or more other features, numbers, steps, operations, components, elements, parts, or combinations thereof.

Terms used in the specification of the present disclosure are terms selected in consideration of functions in the presented embodiments, and the meaning of the terms may vary depending on the intention or custom of a user or operator in the technical field. The meanings of the terms used follow the definitions defined when specifically defined in this specification, and in the absence of specific definitions, they may be interpreted as meanings generally recognized by those skilled in the art. In the description of examples of the present disclosure, descriptions such as "first" and "second" are for distinguishing members, and are not used to limit the members themselves or to mean a specific order.

FIG. 1 is a plan view schematically illustrating a semiconductor wafer 1 according to an embodiment of the present disclosure. The semiconductor wafer 1 may include a plurality of chip regions 10A, 10B, 10C, 10D, 10E, and 10F formed on a substrate, and a scribe lane region 20 located between the plurality of chip regions 10A, 10B, 10C, 10D, 10E, and 10F. In FIG. 1, six chip regions 10A, 10B, 10C, 10D, 10E, and 10F are presented as an example, but the present disclosure is not necessarily limited thereto, and the semiconductor wafer 1 according to an embodiment of the present disclosure may include various numbers of chip regions.

A semiconductor chip may be formed in each of the plurality of chip regions 10A, 10B, 10C, 10D, 10E, and 10F through a semiconductor integration process on the substrate. The semiconductor chips may be the same or substantially the same to each other. Each semiconductor chip may include a plurality of integrated circuit each relating to an operation of the semiconductor chip. After the semiconductor integration process on the substrate is completed, the substrate is separated into each of the chip regions 10A, 10B, 10C, 10D, 10E, and 10F, so that the semiconductor chip may be fabricated in a single chip form.

The scribe lane region 20 is located between and also outside the plurality of chip regions 10A, 10B, 10C, 10D, 10E, and 10F. After the semiconductor chips are formed on the substrate through the semiconductor integration process, the semiconductor chips may be separated from each other by sawing along the scribe lane region 20. Chip guards protecting the chip regions, electrical test patterns, process monitoring patterns, alignment patterns, and the like may be disposed in the scribe lane region 20.

Figure 2A:
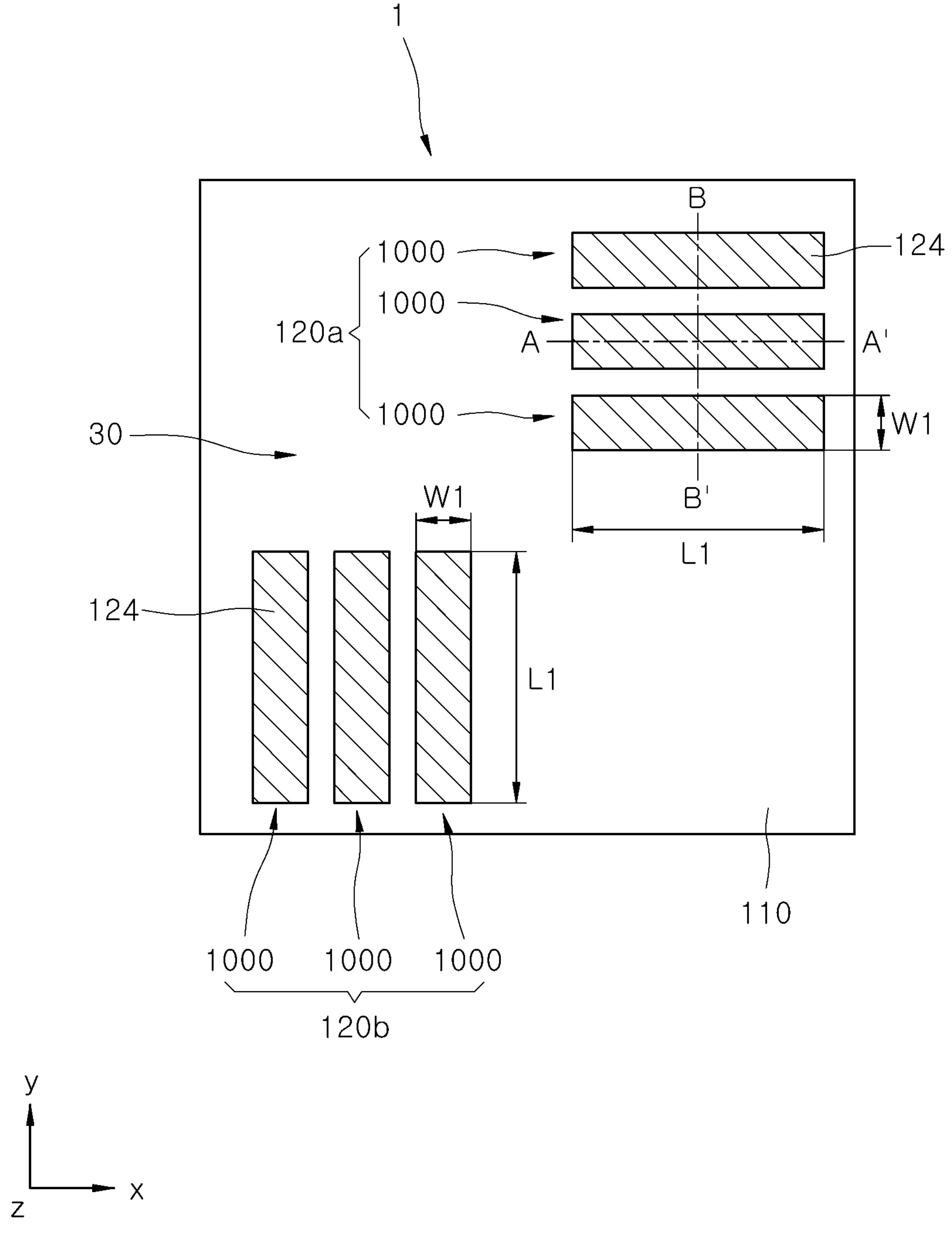
FIG. 2A is a plan view schematically illustrating a semiconductor wafer including an alignment key structure according to an embodiment of the present disclosure.

Referring to FIG. 1, alignment key forming regions 30A, 30B, 30C, and 30D may be defined in the scribe lane region 20. The alignment key forming regions 30A, 30B, 30C, and 30D may be defined in an outer area of the scribe lane region 20 which surrounds the plurality of the chip regions 10A, 10B, 10C, 10D, 10E, and 10F. Referring to FIG. 2A, each of the alignment key forming regions 30A, 30B, 30C, and 30D may be a region where an alignment key structure 30 is formed. The alignment key structure 30 may be a pattern structure that is formed on the semiconductor wafer in advance to align a photomask and the semiconductor wafer in a lithography step of the semiconductor integration process. Although FIG. 1 shows four alignment key forming regions 30A, 30B, 30C, and 30D in the scribe lane region 20 of the semiconductor wafer 1, the present disclosure is not necessarily limited thereto. Various modifications are possible with respect to the number and location of the alignment key forming regions disposed in the scribe lane region 20.

Figure 2B:
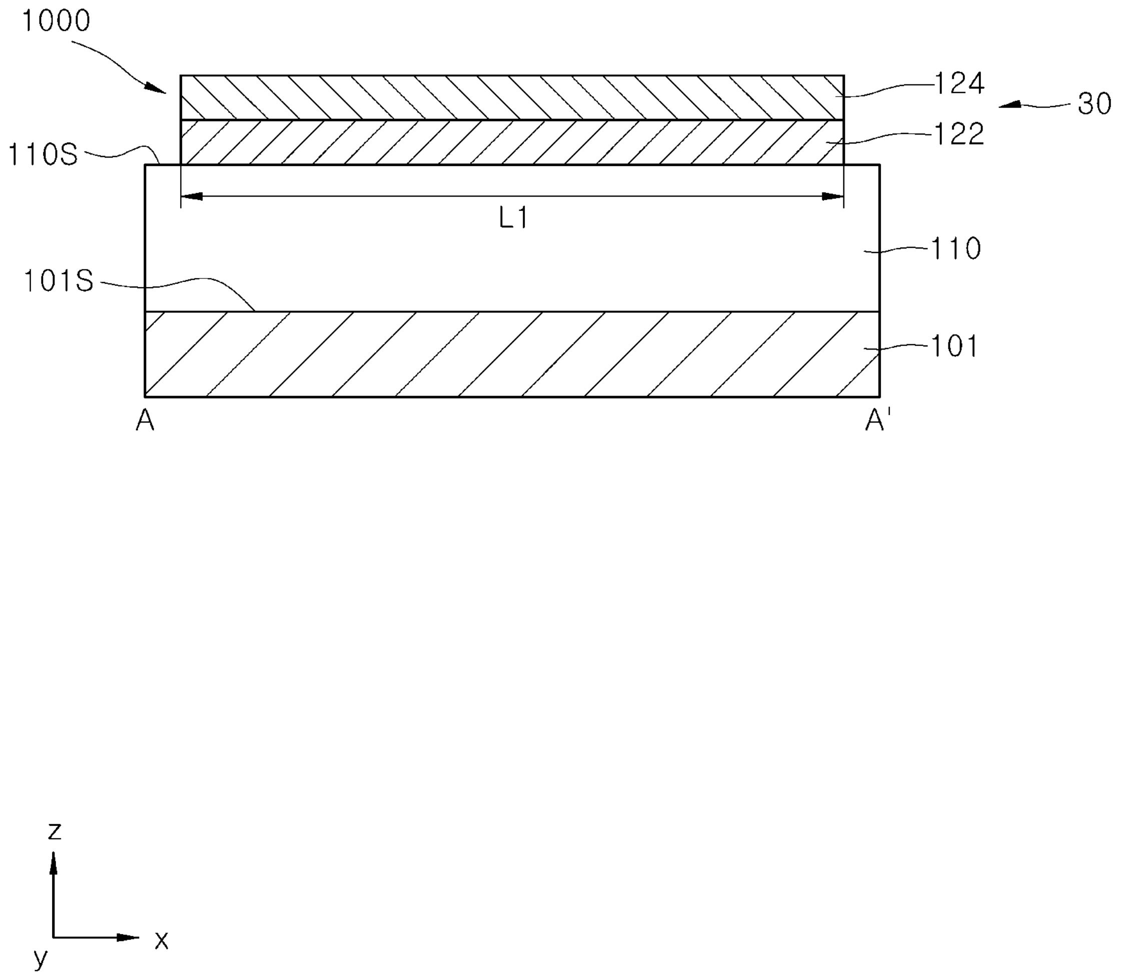
FIG. 2B is a cross-sectional view of the semiconductor wafer of FIG. 2A taken along line A-A'.
Figure 2C:
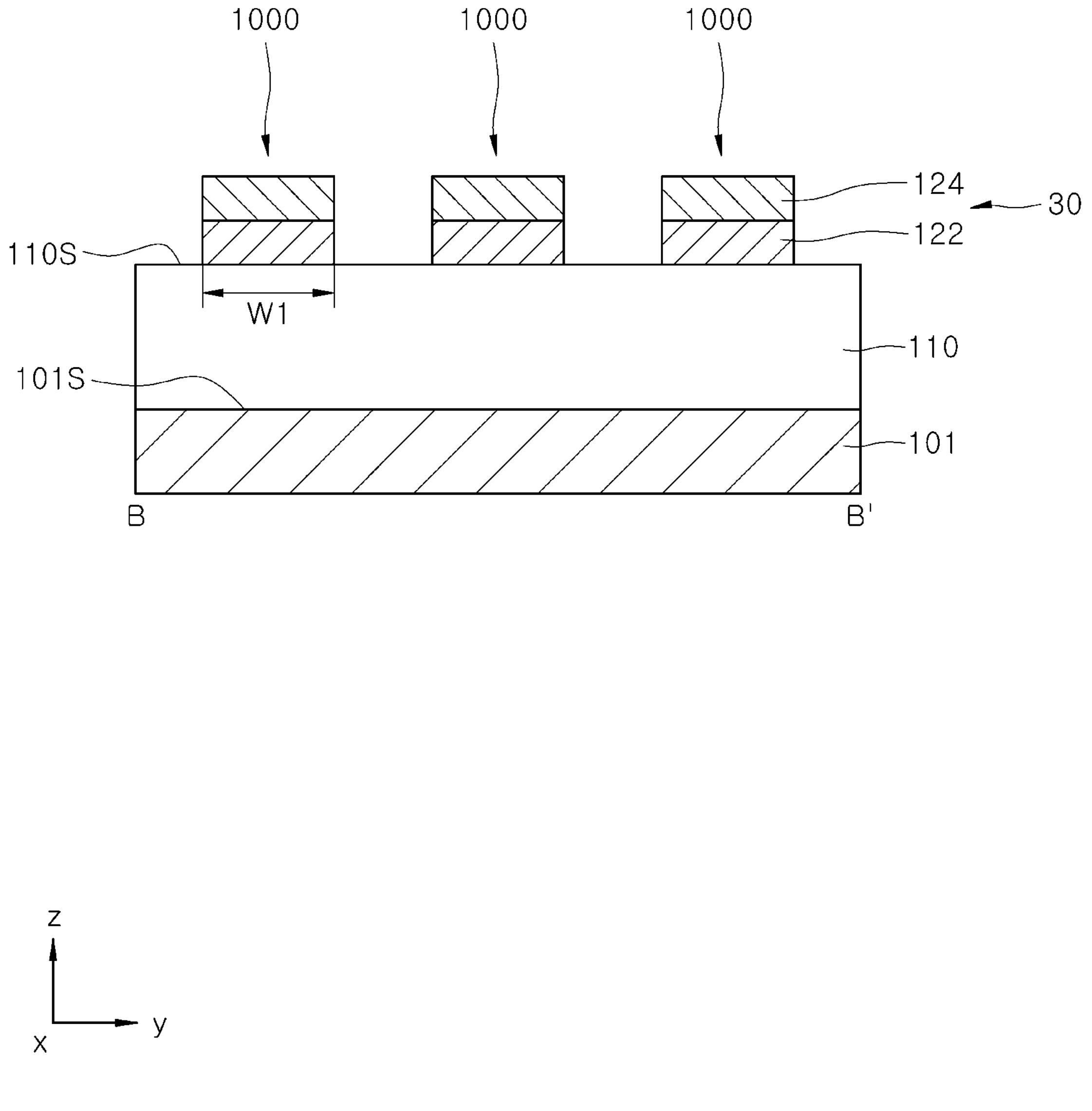
FIG. 2C is a cross-sectional view of the semiconductor wafer of FIG. 2A taken along line B-B'.

FIG. 2A is a plan view schematically illustrating a semiconductor wafer 1 including an alignment key structure according to an embodiment of the present disclosure. FIG. 2B is a cross-sectional view of the semiconductor wafer of FIG. 2A taken along line A-A'. FIG. 2C is a cross-sectional view of the semiconductor wafer of FIG. 2A taken along line B-B'.

Referring to FIGS. 2A to 2C, the semiconductor wafer 1 may include the alignment key structure 30 disposed over a substrate 101. The alignment key structure 30 may be disposed in each of the alignment key forming regions 30A, 30B, 30C, and 30D of the semiconductor wafer 1 of FIG. 1.

The substrate 101 may have material characteristics to which a semiconductor integration process can be applied. The substrate 101 may include, for example, a semiconductor, an insulator, or a conductor. In an example, the substrate 101 may be a semiconductor substrate. The substrate 101 may have well regions doped with an n-type or p-type dopant.

A stacked structure 110 may be disposed in each of the alignment key forming regions 30A, 30B, 30C, and 30D of the substrate 101. In an embodiment, the stacked structure 110 may include at least one conductive layer and at least one insulating layer surrounding the at least one conductive layer. The at least one conductive layer and the at least one insulating layer may be formed simultaneously when at least one circuit pattern layer and at least one interlayer insulating layer surrounding the at least circuit pattern layer are formed in each of the chip regions 10A, 10B, 10C, 10D, 10E, and 10F of the semiconductor wafer 1 of FIG. 1.

Referring to FIGS. 2A to 2C, the alignment key structure 30 may be disposed on the stacked structure 110. As illustrated in FIG. 2A, the alignment key structure 30 may include first and second alignment key pattern layers 120*a* and 120*b* disposed in different areas of the alignment key structure 30 and oriented in different directions. Each of the first and second alignment key pattern layers 120*a* and 120*b* may include a plurality of unit key patterns 1000.

The first alignment key pattern layer 120*a* may be disposed over the substrate 101. In an embodiment, each of the plurality of unit key patterns 1000 of the first alignment key pattern layer 120*a* may extend in a first direction that is substantially parallel to the upper surface 101S of the substrate 101 (e.g., x-direction). In addition, the plurality of unit key patterns 1000 of the first alignment key pattern layer 120*a* may be arranged in a second direction (e.g., y-direction) that is substantially perpendicular to the first direction. Each of the plurality of unit key patterns 1000 of the first alignment key pattern layer 120*a* may have a length L1 along the first direction (e.g., x-direction) and a width W1 along the second direction (e.g., y-direction), and the length L1 may be greater than the width W1.

The second alignment key pattern layer 120*b* may be disposed on the same plane with the first alignment key pattern layer 120*a* over the substrate 101. In an embodiment, each of the plurality of unit key patterns 1000 of the second alignment key pattern layer 120*b* may extend in the second direction (e.g., y-direction). In addition, the plurality of unit key patterns 1000 of the second alignment key pattern layer 120*b* may be arranged in the first direction (e.g., x-direction) that is substantially perpendicular to the second direction. Each of the plurality of unit key patterns 1000 of the second alignment key pattern layer 120*b* may have the length L1 along the second direction (e.g., y-direction) and the width W1 along the first direction (e.g., x-direction), and the length L1 may be greater than the width W1.

The first and second alignment key pattern layers 120*a* and 120*b* may be disposed to be spaced apart from each other on an upper surface 110S of the stacked structure 110. However, the other features of the first and second alignment key pattern layers 120*a* and 120*b* except for their direction or orientation arrangement of the plurality of unit key patterns 1000 may be the same or substantially the same. In an embodiment, as illustrated in FIG. 2A, the plurality of unit key patterns 1000 of each of the first and second alignment key pattern layers 120*a* and 120*b* may have rectangular planar shapes having the same length L1 and the same width W1.

In an embodiment, in a case where the semiconductor chips are respectively formed in the plurality of chip regions 10A, 10B, 10C, 10D, 10E, and 10F are DRAM chips, the plurality of unit key patterns 1000 of the first and second alignment key pattern layers 120*a* and 120*b* may be formed in the same process step as a plate electrode of a cell capacitor of each of the DRAM chips. Accordingly, the plurality of unit key patterns 1000 may be made of the same or substantially the same material as the plate electrode. for example, the cell capacitor may include a storage node electrode and a storage node dielectric layer under the plate electrode. Accordingly, the stacked structure 110 may include structures corresponding to the storage node electrode and the storage node dielectric layer under the plurality of unit key patterns 1000.

In an embodiment, referring to FIGS. 2B and 2C, each of the plurality of unit key patterns 1000 may include a first conductive layer 122 and a second conductive layer 124 disposed on the first conductive layer 122 to correspond to the plate electrode. As an example, the first conductive layer 122 may include conductive silicon germanium (SiGe), and the second conductive layer 124 may include conductive tungsten nitride (WN).

An insulating layer covering the alignment key structure 30 may be disposed over the stacked structure 110. The insulating layer may be disposed to cover the plate electrode of the cell capacitor in each of the chip regions 10A, 10B, 10C, 10D, 10E, and 10F. As an example, the insulating layer may include oxide. In an embodiment, the alignment key structure 30 may be used for alignment between a photomask providing an image of contact hole patterns and the chip regions 10A, 10B, 10C, 10D, 10E, and 10F where the contact hole patterns are to be formed, when a lithography process of forming the contact hole patterns penetrating the insulating layer to expose the plate electrode proceeds, as a step of a backend process of a DRAM chip manufacturing process.

Figure 3A:
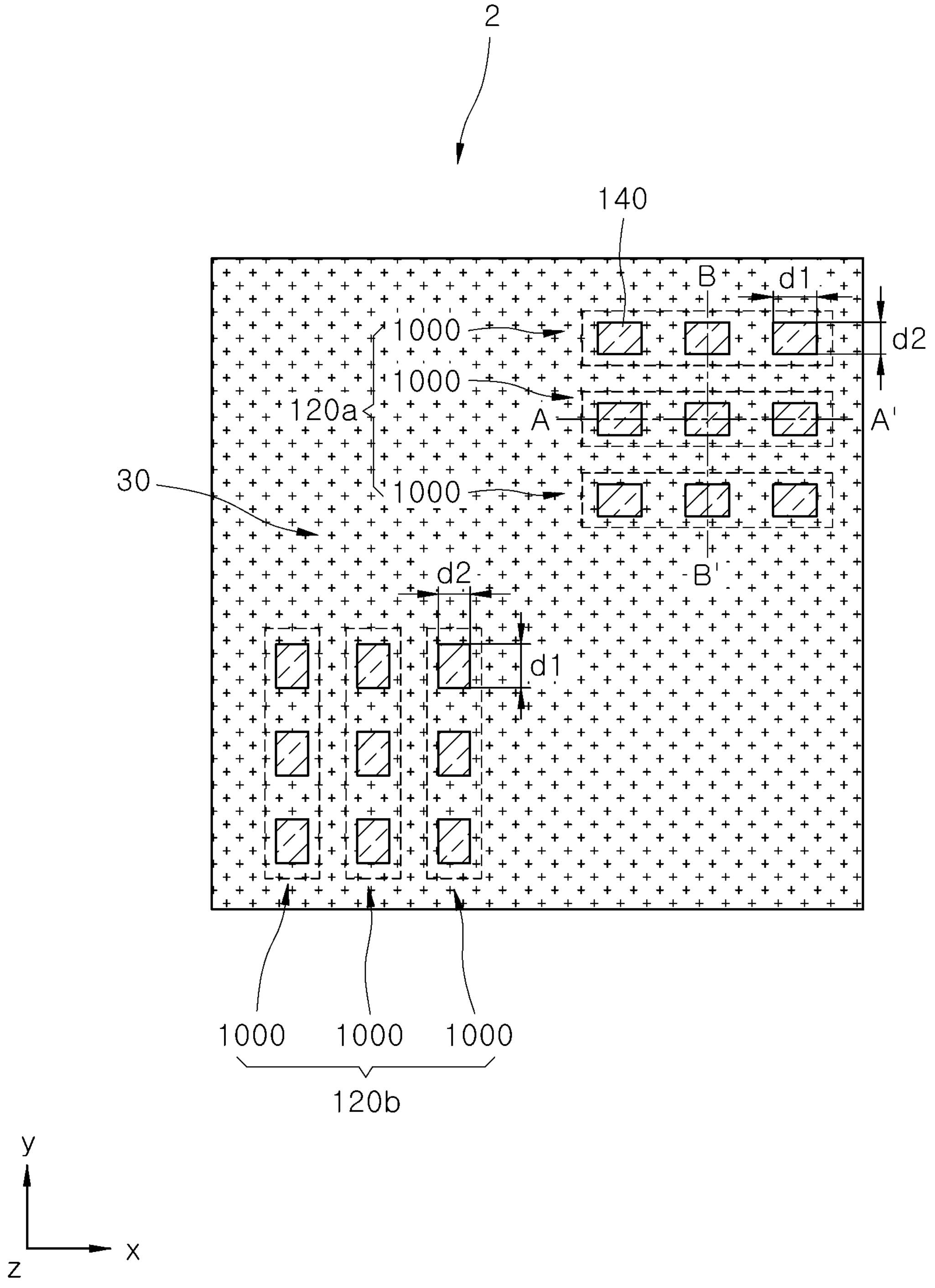
FIG. 3A is a plan view schematically illustrating a semiconductor wafer including an alignment key structure and a contact pattern layer according to an embodiment of the present disclosure.
Figure 3B:
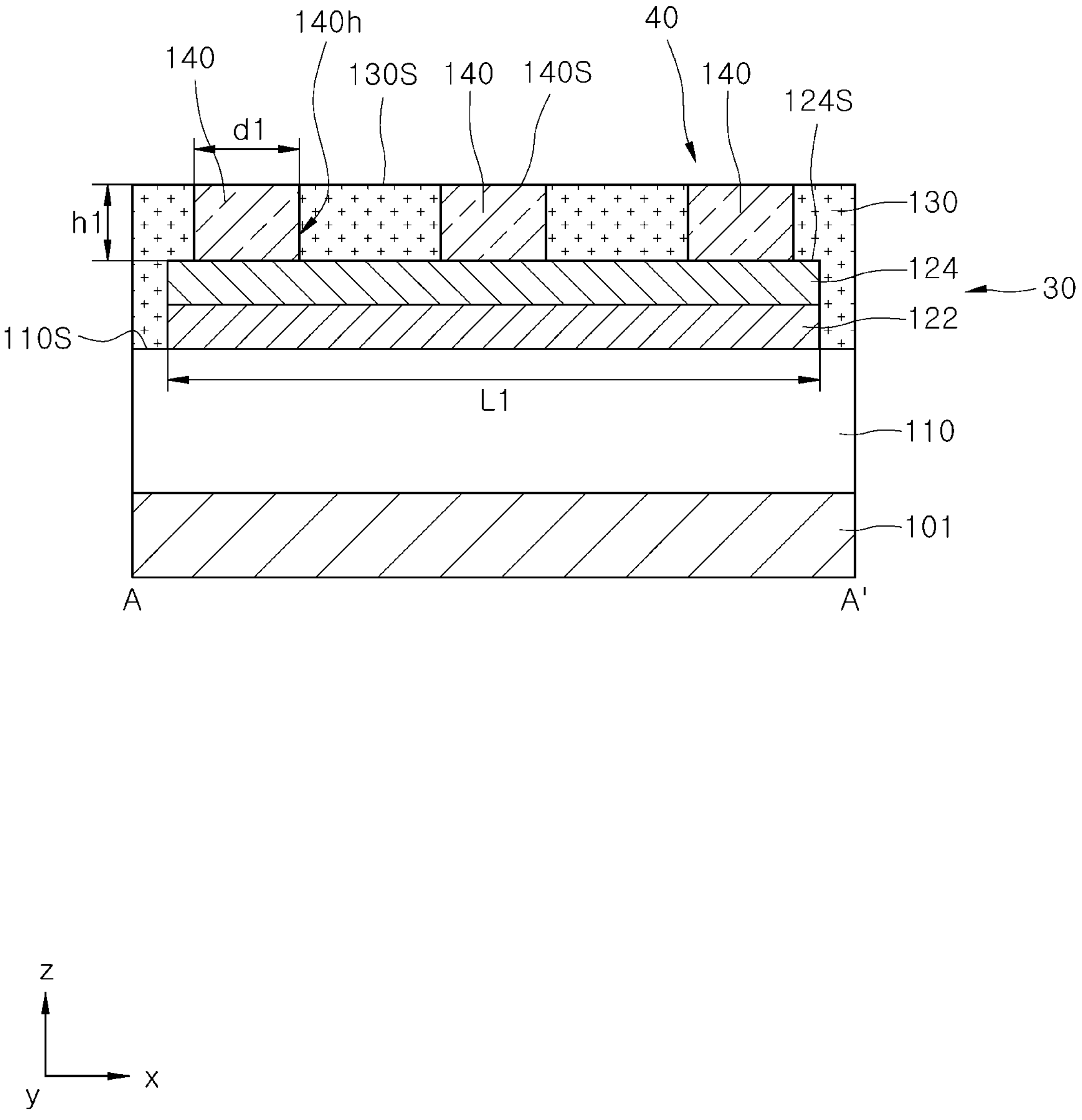
FIG. 3B is a cross-sectional view of the semiconductor wafer of FIG. 3A taken along line A-A'.
Figure 3C:
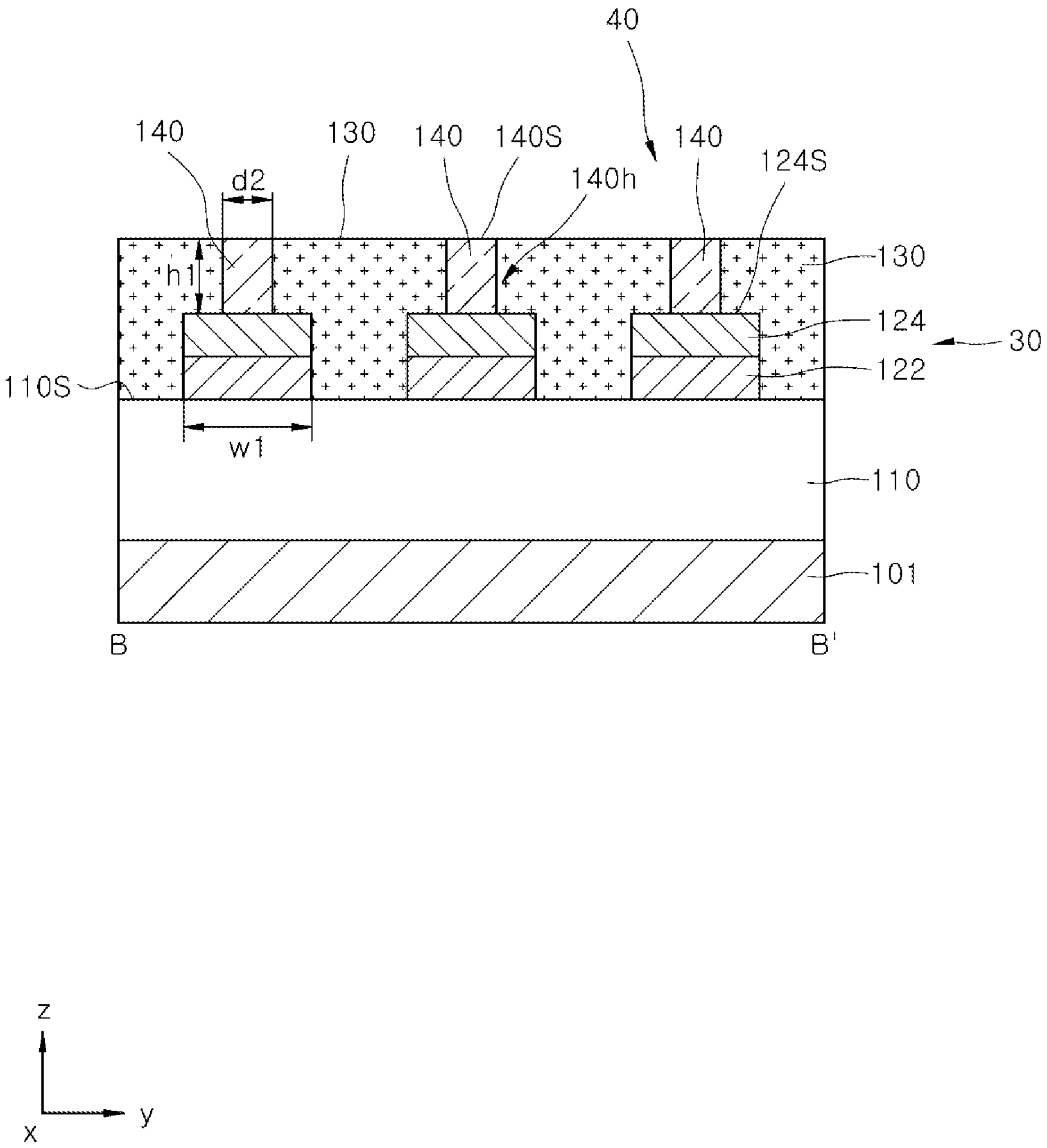
FIG. 3C is a cross-sectional view of the semiconductor wafer of FIG. 3A taken along line B-B'.

FIG. 3A is a plan view schematically illustrating a semiconductor wafer 2 including an alignment key structure and a contact pattern layer according to an embodiment of the present disclosure. FIG. 3B is a cross-sectional view of the semiconductor wafer of FIG. 3A taken along line A-A'. FIG. 3C is a cross-sectional view of the semiconductor wafer of FIG. 3A taken along line B-B'.

Referring to FIGS. 3A to 3C, compared to the semiconductor wafer 1 of FIGS. 2A to 2C, the semiconductor wafer 2 may further include the contact pattern layer 140 disposed on the alignment key structure 30. The contact pattern layer 140 may be disposed on the alignment key structure 30 to extend upward of the alignment key structure 30, for example, in the z-direction. Referring to FIG. 3A, in the plan view, the contact pattern layer 140 may be disposed over the stacked structure 110 within the boundary of the plurality of unit key patterns 1000.

Referring to FIG. 3B, the contact pattern layer 140 may include pillar structures each disposed on an upper surface 124S of each of the plurality of the unit key patterns 1000. As an example, each of the pillar structures may have a quadrangular pillar shape having first and second lengths d1 and d2 and a height h1. As illustrated in FIG. 3B, the first length d1 of the pillar structure may be shorter than the length L1 of the unit key pattern 1000. In addition, as illustrated in FIG. 3C, the second length d2 of the pillar structure may be shorter than the width W1 of the unit key pattern 1000. In some embodiments, the pillar structure may have a shape of a cylinder, an elliptical pillar, or various polygonal pillars.

In an embodiment, the pillar structures may be arranged in one direction on the upper surface 124S of each of the plurality of unit key patterns 1000. As an example, on the unit key pattern 1000 of the first alignment key pattern layer 120*a*, the pillar structures may be arranged in the first direction (e.g., x-direction). As another example, on the unit key pattern 1000 of the second alignment key pattern layer 120*b*, the pillar structures may be arranged in the second direction (e.g., y-direction).

In another embodiment, the pillar structures may be arranged in one direction between neighboring unit key patterns 1000. As an example, the pillar structures disposed on one unit key pattern 1000 of the first alignment key pattern layer 120*a* may be arranged to overlap with the pillar structures disposed on neighboring another unit key pattern 1000 in the second direction (e.g., y-direction). As another example, the pillar structures disposed on one unit key pattern 1000 of the second alignment key pattern layer 120*b* may be arranged to overlap with the pillar structures disposed on the neighboring unit key pattern 1000 in the first direction (e.g., x-direction).

In an embodiment, the alignment key structure 30 may include a nitride of a first metal, and the contact pattern layer 140 may include the first metal. As an example, the second conductive layer 124 of each of the plurality of unit key patterns 1000 may include tungsten nitride (WN), and the contact pattern layer 140 may include tungsten (W).

Referring to FIGS. 3A to 3C, an insulating layer 130 in contact with the alignment key structure 30 and the contact pattern layer 140 may be disposed on the stacked structure 110. The insulating layer 130 may include, for example, an oxide, such as, for example, tetraethyl orthosilicate (TEOS), undoped silica glass (USG), and the like. The oxide may have a porous structure so as to have a low permittivity. The insulating layer 130 may be composed of a single layer or multiple layers.

In an embodiment, the contact pattern layer 140 may be formed as follows. First, the insulating layer 130 covering the alignment key structure 30 may be formed on the stacked structure 110. Next, the insulating layer 130 may be selectively etched to form contact hole patterns 140*h* that selectively expose the alignment key structure 30. Next, the contact hole patterns 140*h* may be filled with a metal to form the contact pattern layer 140. In some embodiments, a planarization process may be additionally performed so that an upper surface 140S of the contact pattern layer 140 and an upper surface 130S of the insulating layer 130 are located at the same or substantially the same level.

In an embodiment, the contact pattern layer 140 may serve to alleviate the stress generated between the alignment key structure 30 and the insulating layer 130. In an embodiment, when the alignment key structure 30 includes metal nitride and the insulating layer 130 includes porous oxide, the stress may occur due to different thermal expansion characteristics in the alignment key structure 30 and the insulating layer 130. As an example, when the semiconductor wafer 2 undergoes a thermal process of the semiconductor integration process, the volume expansion of the insulating layer 130 due to thermal deformation may be greater than that of the alignment key structure 30. In this case, as a contact area between the alignment key structure 30 and the insulating layer 130 increases, the stress due to the thermal deformation difference between the alignment key structure 30 and the insulating layer 130 may increase. Accordingly, when the stress exceeds a critical value, a phenomenon in which the insulating layer 130 is separated from the alignment key structure 30 may occur.

According to an embodiment of the present disclosure, the contact pattern layer 140 may penetrate the insulating layer 130 to be disposed to contact the second conductive layer 124 of the unit key pattern 1000. In an embodiment, each of the pillar structures of the contact pattern layer 140 may serve as a barrier to alleviate the stress propagating in a lateral direction (e.g., x-direction or y-direction) inside the insulating layer 130. Accordingly, the stress generated in the insulating layer 130 due to thermal deformation difference may be reduced. As a result, the contact pattern layer 140 formed on the second conductive layer 124 may improve adhesion between the second conductive layer 124 and the insulating layer 130.

Referring to FIGS. 3A to 3C, the upper surface 140S of the contact pattern layer 140 and the upper surface 130S of the insulating layer 130 may be planarized to be located at the same or substantially the same level. In a subsequent semiconductor integration process, another insulating layer may be disposed on the contact pattern layer 140 and the insulating layer 130. In an embodiment, another insulating layer and the insulating layer 130 may be made of the same or substantially the same material. Alternatively, another insulating layer and the insulating layer 130 may be made of different materials.

As described above, in an embodiment of the present disclosure, the semiconductor wafer 2 may include a stress alleviation structure 40 which includes the contact pattern layer 140 disposed on the alignment key structure 30. The contact pattern layer 140 may alleviate the stress generated in the insulating layer 130 due to a thermal deformation difference.

Figure 4A:
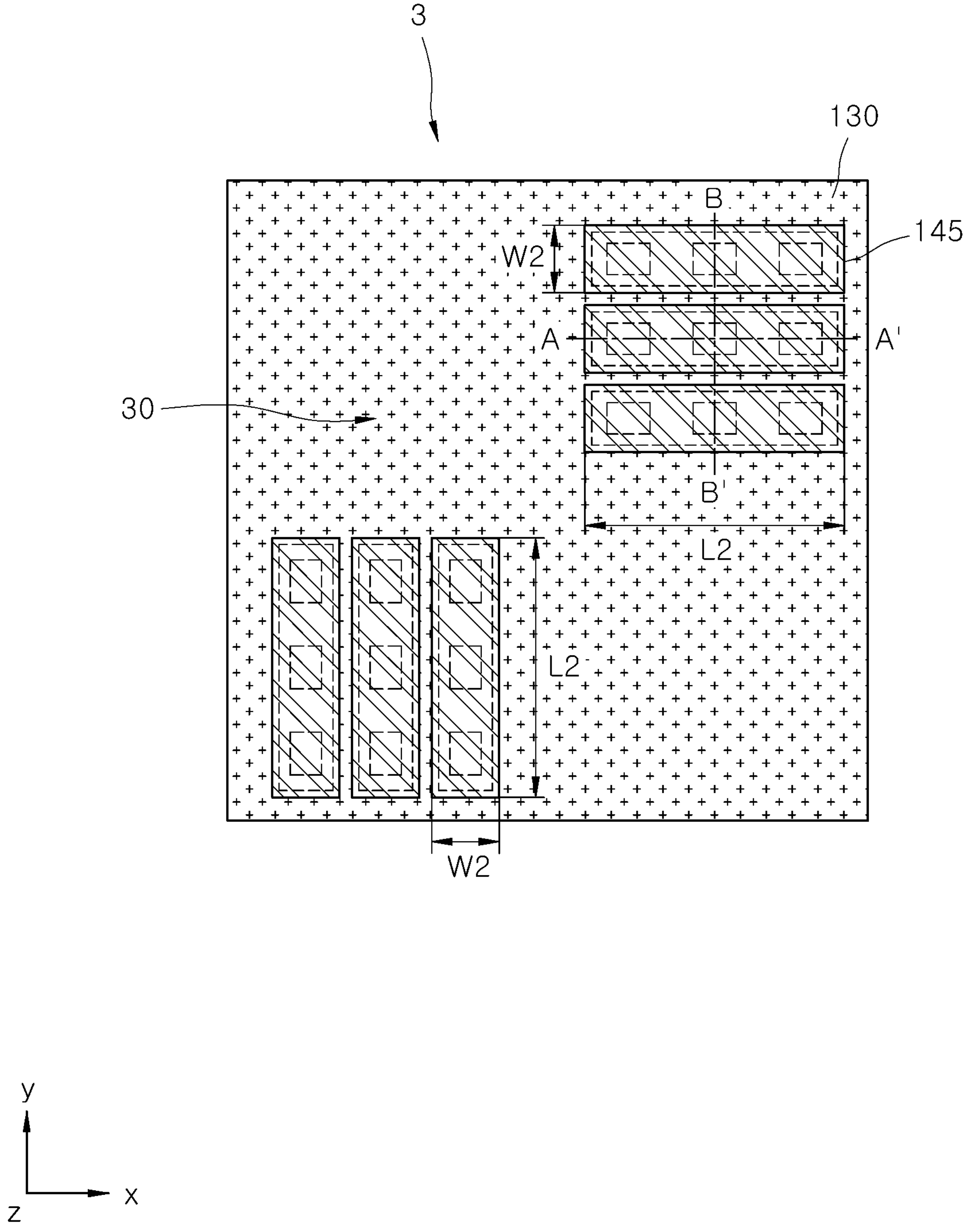
FIG. 4A is a plan view schematically illustrating a semiconductor wafer including an alignment key structure, a contact pattern layer, and a connection pattern layer according to an embodiment of the present disclosure.
Figure 4B:
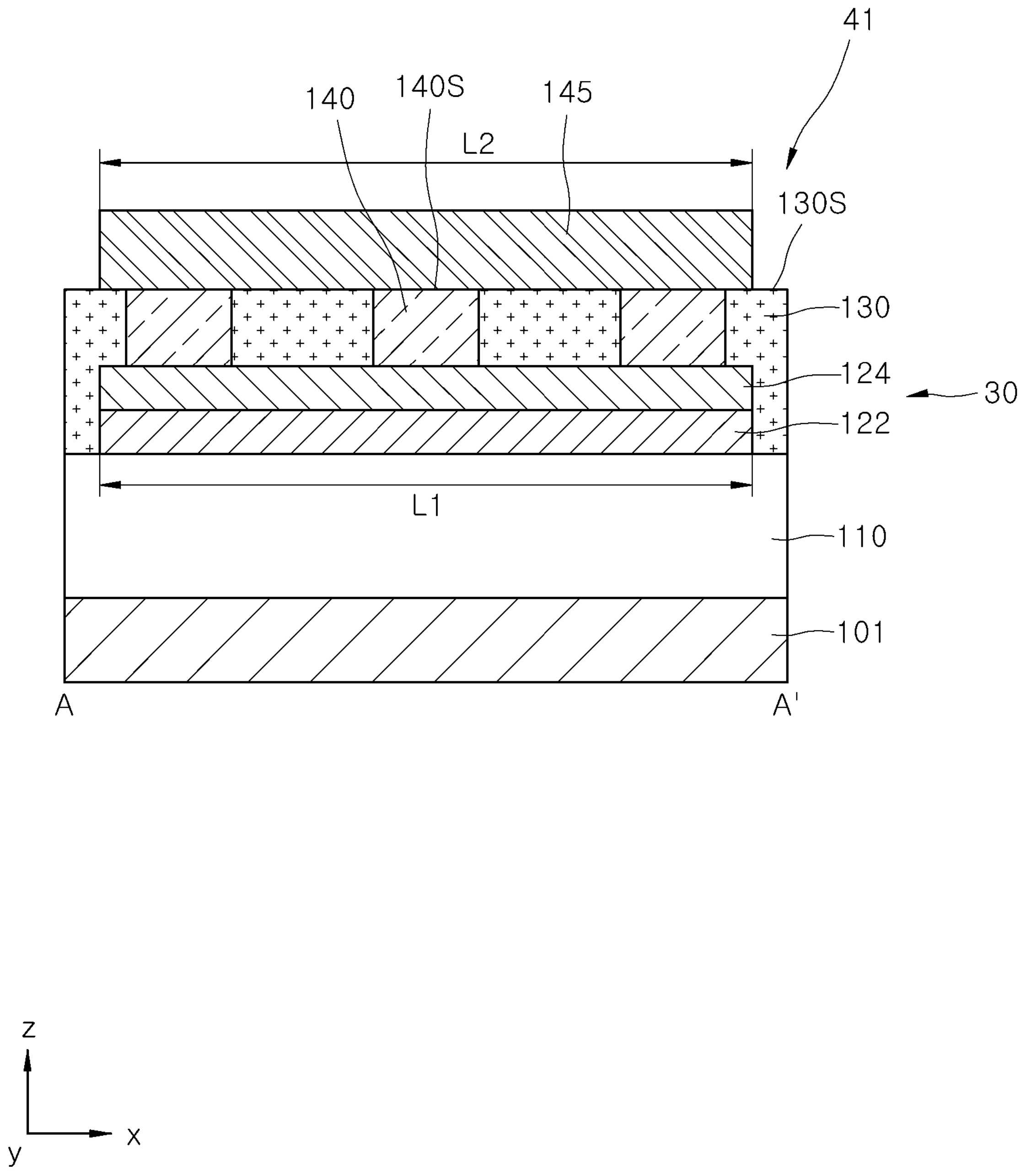
FIG. 4B is a cross-sectional view of the semiconductor wafer of FIG. 4A taken along line A-A'.
Figure 4C:
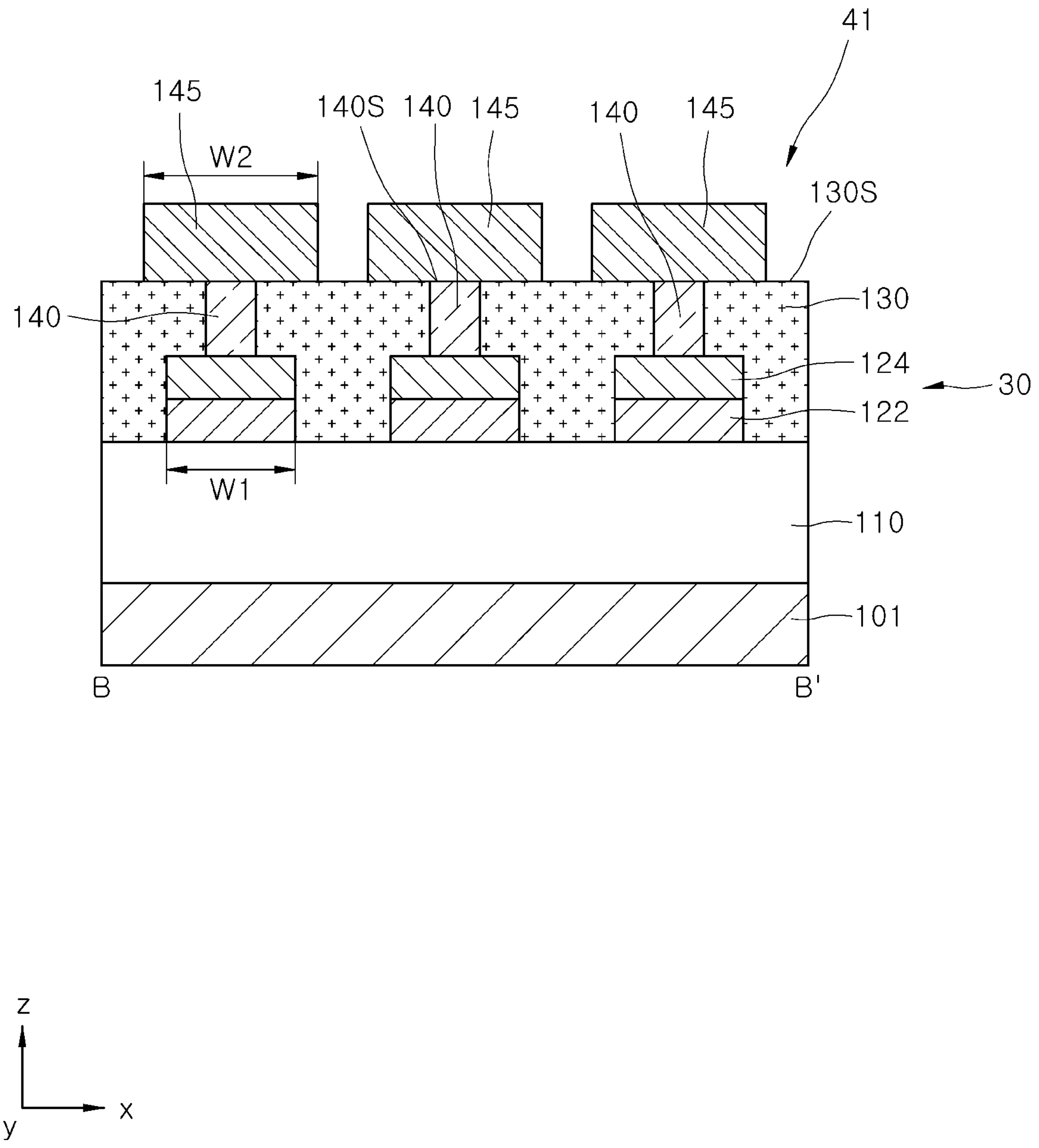
FIG. 4C is a cross-sectional view of the semiconductor wafer of FIG. 4A taken along line B-B'.

FIG. 4A is a plan view schematically illustrating a semiconductor wafer 3 including an alignment key structure, a contact pattern layer, and a connection pattern layer according to an embodiment of the present disclosure. FIG. 4B is a cross-sectional view of the semiconductor wafer of FIG. 4A taken along line A-A'. FIG. 4C is a cross-sectional view of the semiconductor wafer of FIG. 4A taken along line B-B'.

Referring to FIGS. 4A to 4C, compared to the semiconductor wafer 2 of FIGS. 3A to 3C, the semiconductor wafer 3 may further include the connection pattern layer 145 disposed to cover the contact pattern layer 140 over the alignment key structure 30. In an embodiment, in a case that the alignment key structure 30 includes a plurality of unit key patterns 1000 disposed over the substrate 101, the connection pattern layer 145 may be disposed to correspond to each of the plurality of unit key patterns 1000.

In an embodiment, the connection pattern layer 145 may overlap with at least a portion of the alignment key structure 30. In an embodiment, the connection pattern layer 145 disposed on a first alignment key pattern layer 120*a* may be disposed to cover a plurality of unit key patterns 1000 of the first alignment key pattern layer 120*a*. The connection pattern layer 145 disposed on the first alignment key pattern layer 120*a* may have a length L2 along the first direction (e.g., x-direction) and a width W2 along the second direction (e.g., y-direction) and the length L2 and the width W2 of the connection pattern layer 145 may be greater than the length L1 and the width W1 of each of the plurality of unit key patterns 1000 of the first alignment key pattern layer 120*a*, respectively. Similarly, the connection pattern layer 145 disposed on the second alignment key pattern layer 120*b* may be disposed to cover the plurality of unit key patterns 1000 of the second alignment key pattern layer 120*b*. The connection pattern layer 145 disposed on the second alignment key pattern layer 120*b* may have the length L2 along the second direction (e.g., y-direction) and the width W2 along the first direction (e.g., x-direction) and the length L2 and the width W2 of the connection pattern layer 145 may be greater than the length L1 and the width W1 of the plurality of unit key patterns 1000 of the second alignment key pattern layer 120*b*, respectively.

Referring to FIGS. 4A to 4C, the connection pattern layer 145 may be disposed on an upper surface 140S of the contact pattern layer 140 and an upper surface 130S of the insulating layer 130. In an embodiment, the alignment key structure 30 may include a nitride of a first metal, the contact pattern layer 140 may include the first metal, and the connection pattern layer 145 may include a second metal that is different from the first metal. As an example, a second conductive layer 124 of the alignment key structure 30 may include tungsten nitride (WN), the contact pattern layer 140 may include tungsten (W), and the connection pattern layer 145 may include copper (Cu). The insulating layer 130 may include oxide. The oxide may include, for example, tetraethyl orthosilicate (TEOS), undoped silica glass (USG), and the like. The oxide may have a porous structure so as to have a low permittivity.

In an embodiment, the process of forming the connection pattern layer 145 may include forming a metal layer on the insulating layer 130 and the contact pattern layer 140 and selectively etching the metal layer to form a metal pattern layer.

As described above, in an embodiment of the present disclosure, the semiconductor wafer 3 may include a stress alleviation structure 41 disposed over the alignment key structure 30. The stress alleviation structure 41 may include the contact pattern layer 140 and the connection pattern layer 145. The connection pattern layer 145 may be disposed to cover the contact pattern layer 140 inside the insulating layer 130, so that the stress generated in the insulating layer 130 due to a thermal deformation difference may be alleviated, together with the contact pattern layer 140.

Figure 5A:
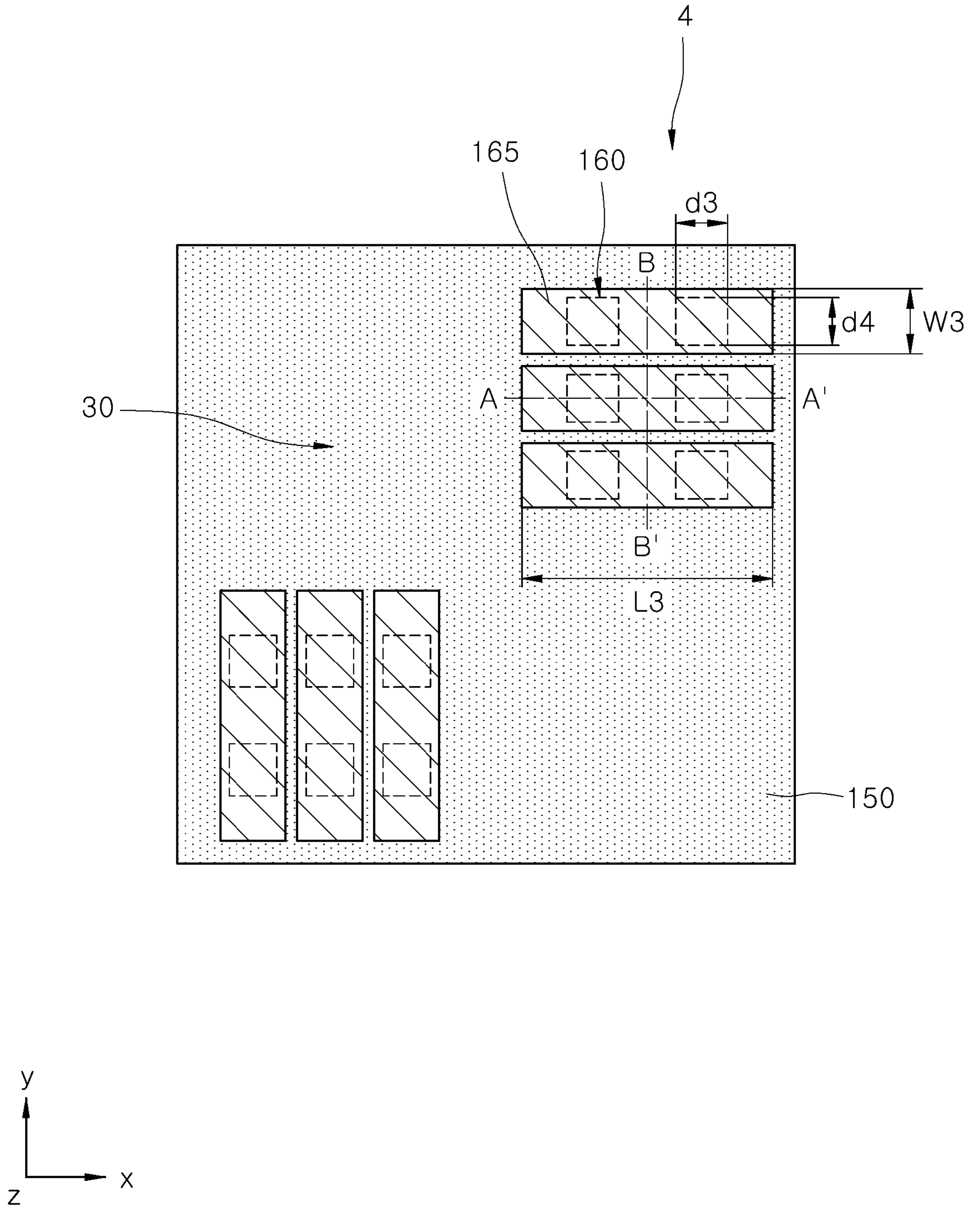
FIG. 5A is a plan view schematically illustrating a semiconductor wafer including an alignment key structure, a contact pattern layer, and a connection pattern layer according to another embodiment of the present disclosure.
Figure 5B:
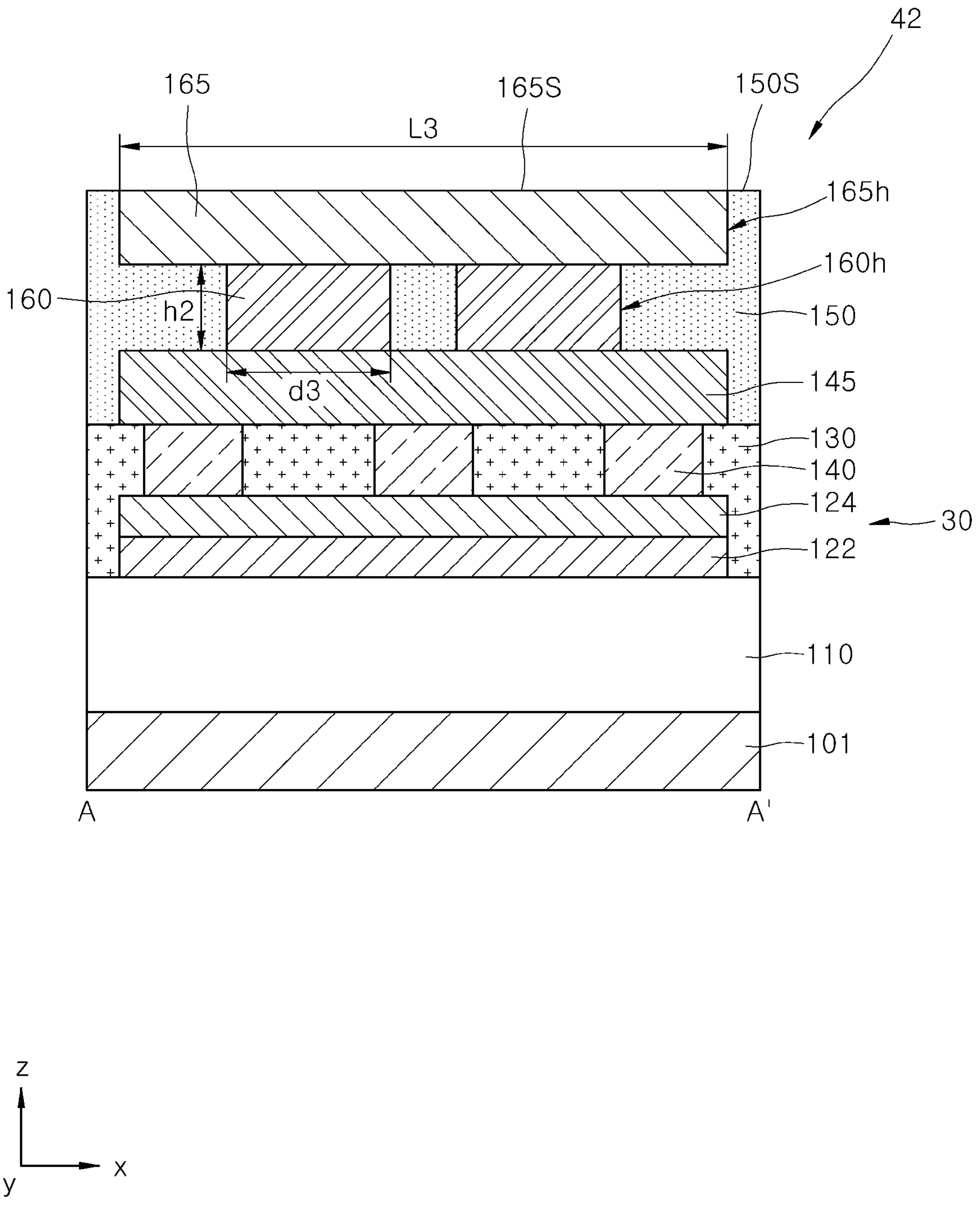
FIG. 5B is a cross-sectional view of the semiconductor wafer of FIG. 5A taken along line A-A'.
Figure 5C:
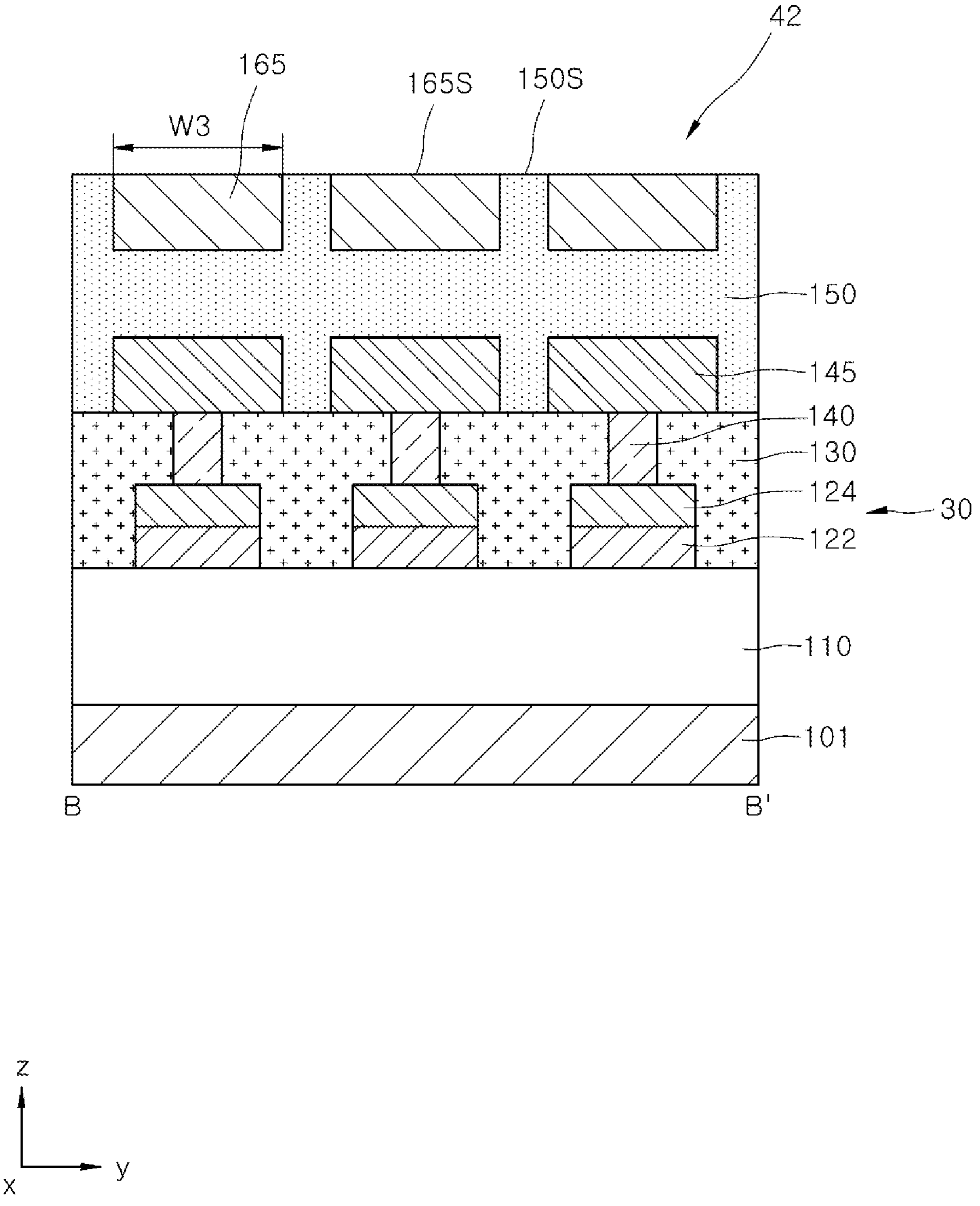
FIG. 5C is a cross-sectional view of the semiconductor wafer of FIG. 5A taken along line B-B'.

FIG. 5A is a plan view schematically illustrating a semiconductor wafer 4 including an alignment key structure, contact pattern layers, and connection pattern layers according to another embodiment of the present disclosure. FIG. 5B is a cross-sectional view of the semiconductor wafer of FIG. 5A taken along line A-A'. FIG. 5C is a cross-sectional view of the semiconductor wafer of FIG. 5A taken along line B-B'.

Referring to FIGS. 5A to 5C, compared to the semiconductor wafer 3 of FIGS. 4A to 4C, the semiconductor wafer 4 may further include a contact pattern layer 160 and a connection pattern layer 165 that are disposed over a connection pattern layer 145. For convenience of description, hereinafter, a contact pattern layer 140 disposed on the alignment key structure 30 is referred to as a first contact pattern layer 140, and the contact pattern layer 160 disposed on the connection pattern layer 145 is referred to as a second contact pattern layer 160. In addition, the connection pattern layer 145 covering the first contact pattern layer 140 is referred to as a first connection pattern layer 145, and the connection pattern layer 165 covering the second contact pattern layer 160 is referred to as a second connection pattern layer 165.

Referring to FIGS. 5A to 5C, the second contact pattern layer 160 may be disposed on the first connection pattern layer 145 and may extend upward of the first connection pattern layer 145, for example, in the z-direction. As illustrated in FIGS. 5A and 5B, the second contact pattern layer 160 may include pillar structures disposed on the first connection pattern layer 145. As an example, each of the pillar structures may have a quadrangular pillar shape having first and second lengths d3 and d4 and a height h2. In some embodiments, the pillar structure may have a shape of a cylinder, an elliptical pillar, or various polygonal pillars.

The second connection pattern layer 165 may be disposed on the second contact pattern layer 160 and may be disposed to cover the second contact pattern layer 160. The second connection pattern layer 165 may have a length L3 and a width W3. The second connection pattern layer 165 may overlap with at least a portion of the first connection pattern layer 145 in a third direction (e.g., z-direction). For example, the first and second connection pattern layers 145 and 165 may overlap with each other.

In an embodiment, the second contact pattern layer 160 and the second connection pattern layer 165 may be formed through a dual damascene process. Specifically, another insulating layer 150 covering the first connection pattern layer 145 may be formed on the insulating layer 130. The lower insulating layer 130 which is located at a lower level is referred to as a first insulating layer 130 and the insulating layer 150 located at an upper level is referred to as a second insulating layer 150. Contact hole patterns 160*h* may be formed to penetrate the second insulating layer 150 to expose the first connection pattern layer 145, and a trench pattern 165*h* may be formed on the contact hole patterns 160*h*. Subsequently, the contact hole patterns 160*h* and the trench pattern 165*h* may be filled with a metal to form the second contact pattern layer 160 and the second connection pattern layer 165 at the same time. Accordingly, the second contact pattern layer 160 and the second connection pattern layer 165 may be made of the same or substantially the same material. As an example, the second contact pattern layer 160 and the second connection pattern layer 165 may include copper (Cu). In some embodiments, a planarization process may be additionally performed to the second connection pattern layer 165 and the second insulating layer 150 so that an upper surface 165S of the second connection pattern layer 165 and an upper surface 150S of the second insulating layer 150 are located at the same level.

The second insulating layer 150 may include oxide. The oxide may include, for example, tetraethyl orthosilicate (TEOS), undoped silica glass (USG), and the like. The oxide may have a porous structure so as to have a low permittivity. In an embodiment, the second insulating layer 150 may be made of the same material as the first insulating layer 130. In another embodiment, the second insulating layer 150 may be made of a material different from that of the first insulating layer 130.

As described above, in an embodiment of the present disclosure, the semiconductor wafer 4 may include a stress alleviation structure 42 disposed over the alignment key structure 30. The stress alleviation structure 42 may include the first and second contact pattern layers 140 and 160 and the first and second connection pattern layers 145 and 165. The first and second contact pattern layers 140 and 160 and the first and second connection pattern layers 145 and 165 may alleviate any stress generated in the first and second insulating layers 130 and 150 due to a thermal deformation difference.

Figure 6A:
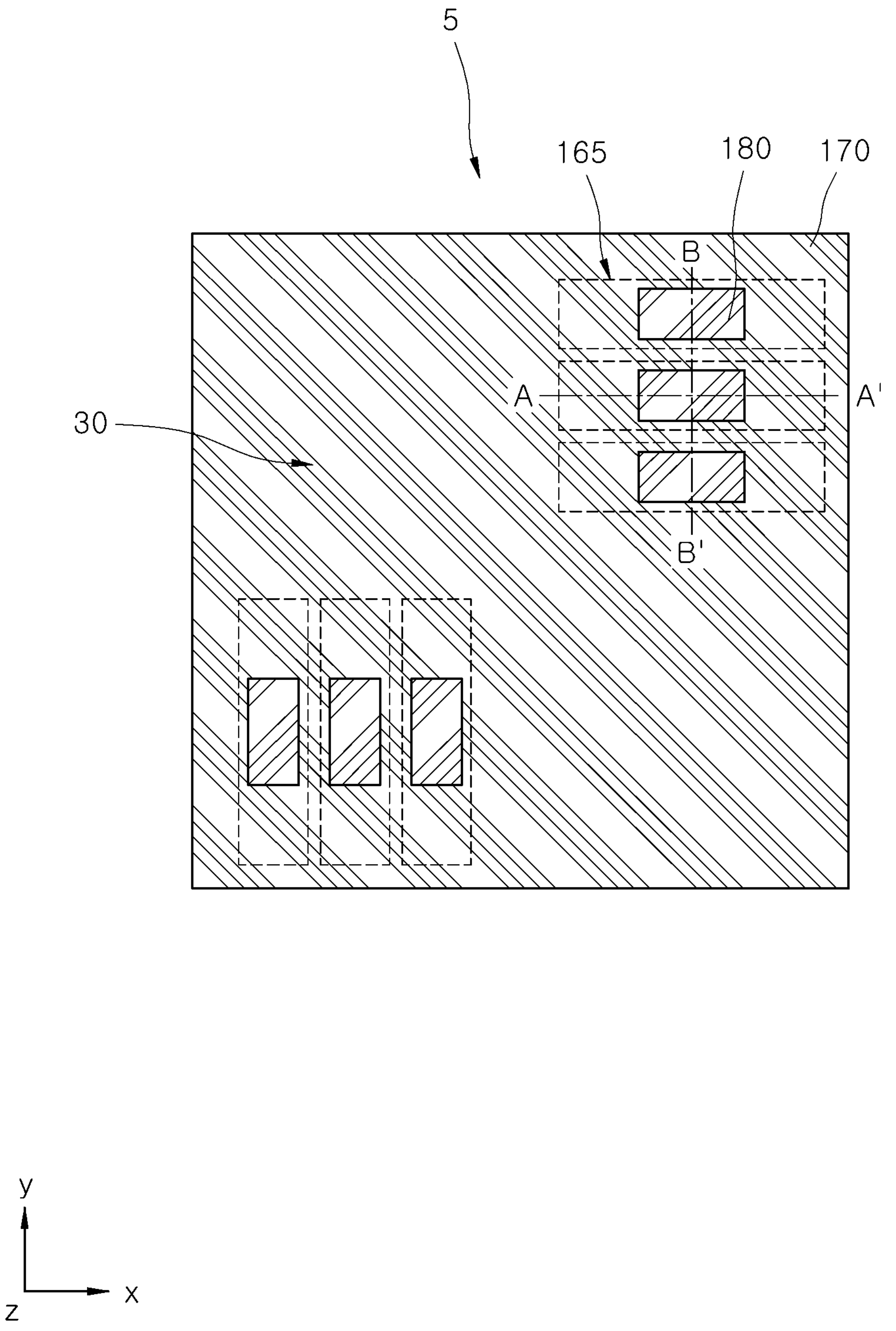
FIG. 6A is a plan view schematically illustrating a semiconductor wafer including an alignment key structure, a contact pattern layer, and a connection pattern layer according to another embodiment of the present disclosure.
Figure 6B:
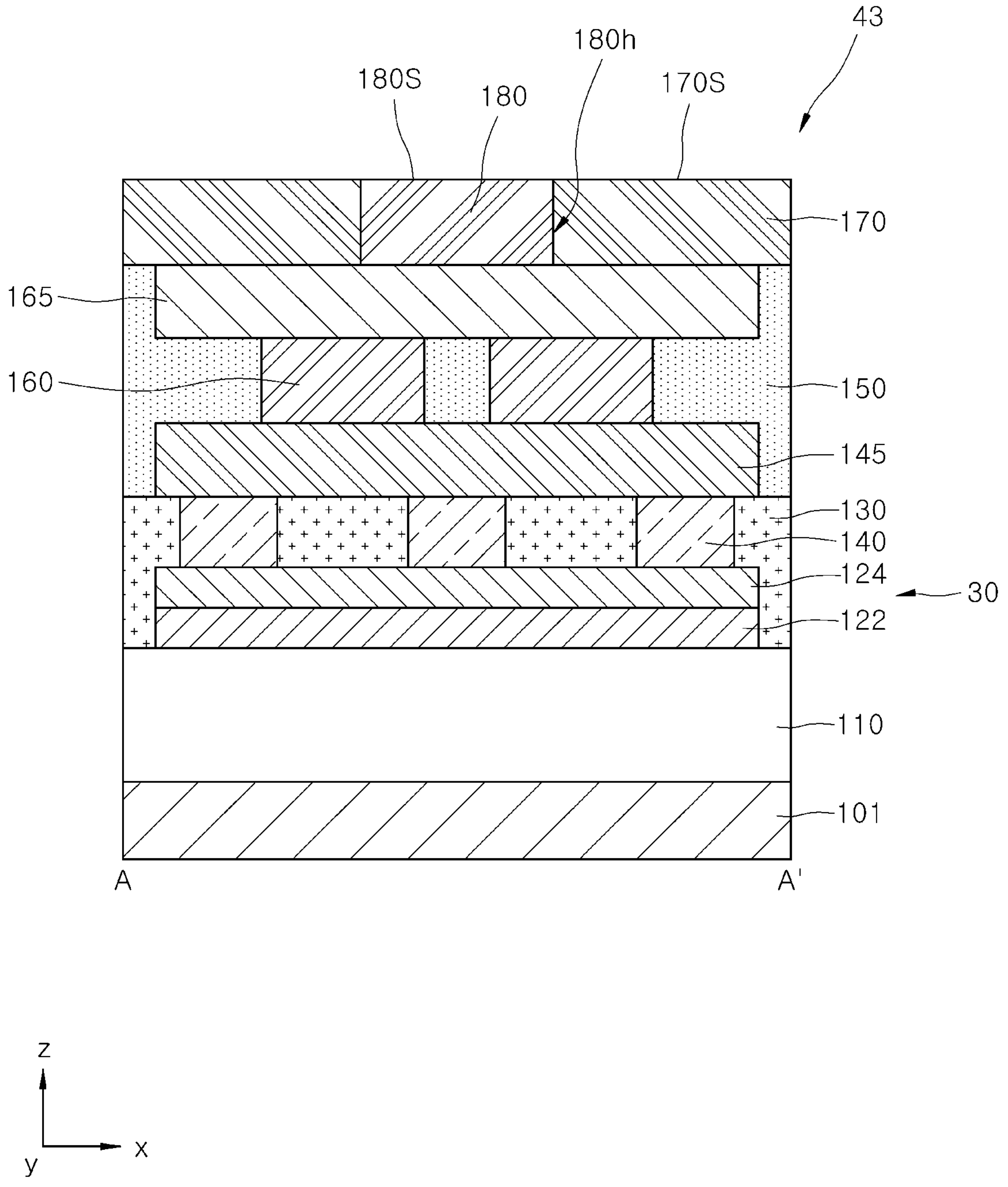
FIG. 6B is a cross-sectional view of the semiconductor wafer of FIG. 6A taken along line A-A'.
Figure 6C:
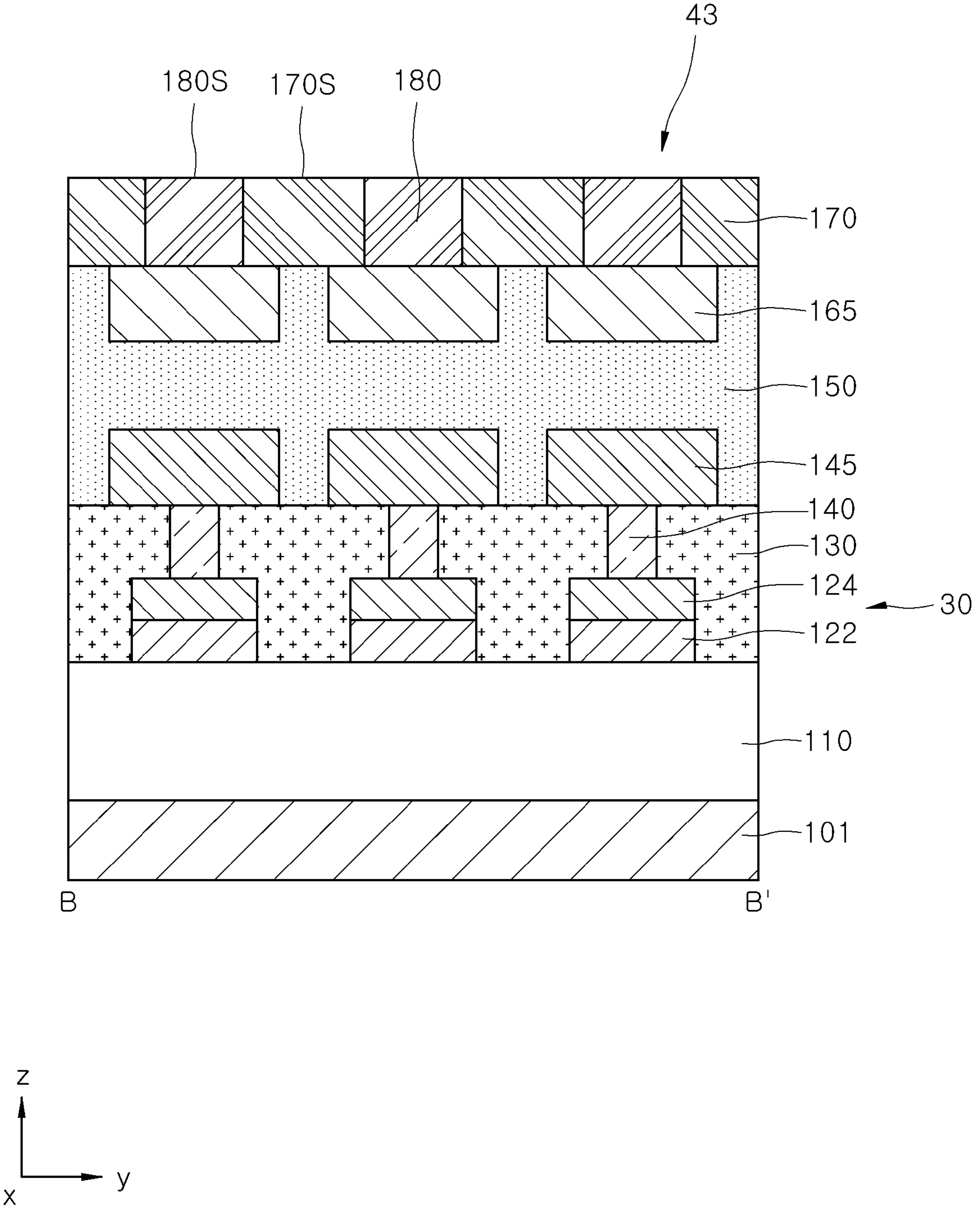
FIG. 6C is a cross-sectional view of the semiconductor wafer of FIG. 6A taken along line B-B'.

FIG. 6A is a plan view schematically illustrating a semiconductor wafer 5 including an alignment key structure, contact pattern layers, and connection pattern layers according to another embodiment of the present disclosure. FIG. 6B is a cross-sectional view of the semiconductor wafer of FIG. 6A taken along line A-A'. FIG. 6C is a cross-sectional view of the semiconductor wafer of FIG. 6A taken along the line B-B'.

Referring to FIGS. 6A to 6C, compared to the semiconductor wafer 4 of FIGS. 5A to 5C, the semiconductor wafer 5 may further include a contact pattern layer 180 disposed on the second connection pattern layer 165. The contact pattern layer 180 will be referred to as a third contact pattern layer 180 hereinafter. The third contact pattern layer 180 may be disposed on the second connection pattern layer 165 to extend upward of the second connection pattern layer 165, for example, in the z-direction. The third contact pattern layer 180 may include pillar structures in the form of a cylinder, an elliptical pillar, or various polygonal pillars. As illustrated in FIGS. 6A and 6B, in the plan view, the third contact pattern layer 180 may be disposed over the second insulating layer 150 within the boundary of the second connection pattern layer 165.

In an embodiment, a method of forming the third contact pattern layer 180 may include forming an insulating layer 170 (hereinafter, referred to as a third insulating layer 170) on the second connection pattern layer 165 and second insulating layer 150, forming contact hole patterns 180*h* exposing the second connection pattern layer 165 by selectively etching the insulating layer 170, and forming the third contact pattern layer 180 by filling the contact hole patterns 180*h* with a metal. A planarization process may be performed to the third contact pattern layer 180 and the third insulating layer 170 so that the upper surface 180S of the third contact pattern layer 180 and the upper surface 170S of the third insulating layer 170 are located at the same or substantially the same level. The third contact pattern layer 180 may include, for example, copper (Cu). The third insulating layer 170 may include oxide. The oxide may include, for example, tetraethyl orthosilicate (TEOS), undoped silica glass (USG), and the like. The oxide may have a porous structure so as to have a low permittivity.

As described above, in an embodiment of the present disclosure, the semiconductor wafer 5 may include a stress alleviation structure 43 disposed over the alignment key structure 30. The stress alleviation structure 43 may include the first to third contact pattern layers 140, 160, and 180 and the first and second connection pattern layers 145 and 165 which are disposed over the alignment key structure 30. The first to third contact pattern layers 140, 160, and 180 and the first and second connection pattern layers 145 and 165 may alleviate the stress generated in the first to third insulating layers 130, 150, and 170 due to a thermal deformation difference.

Figure 7A:
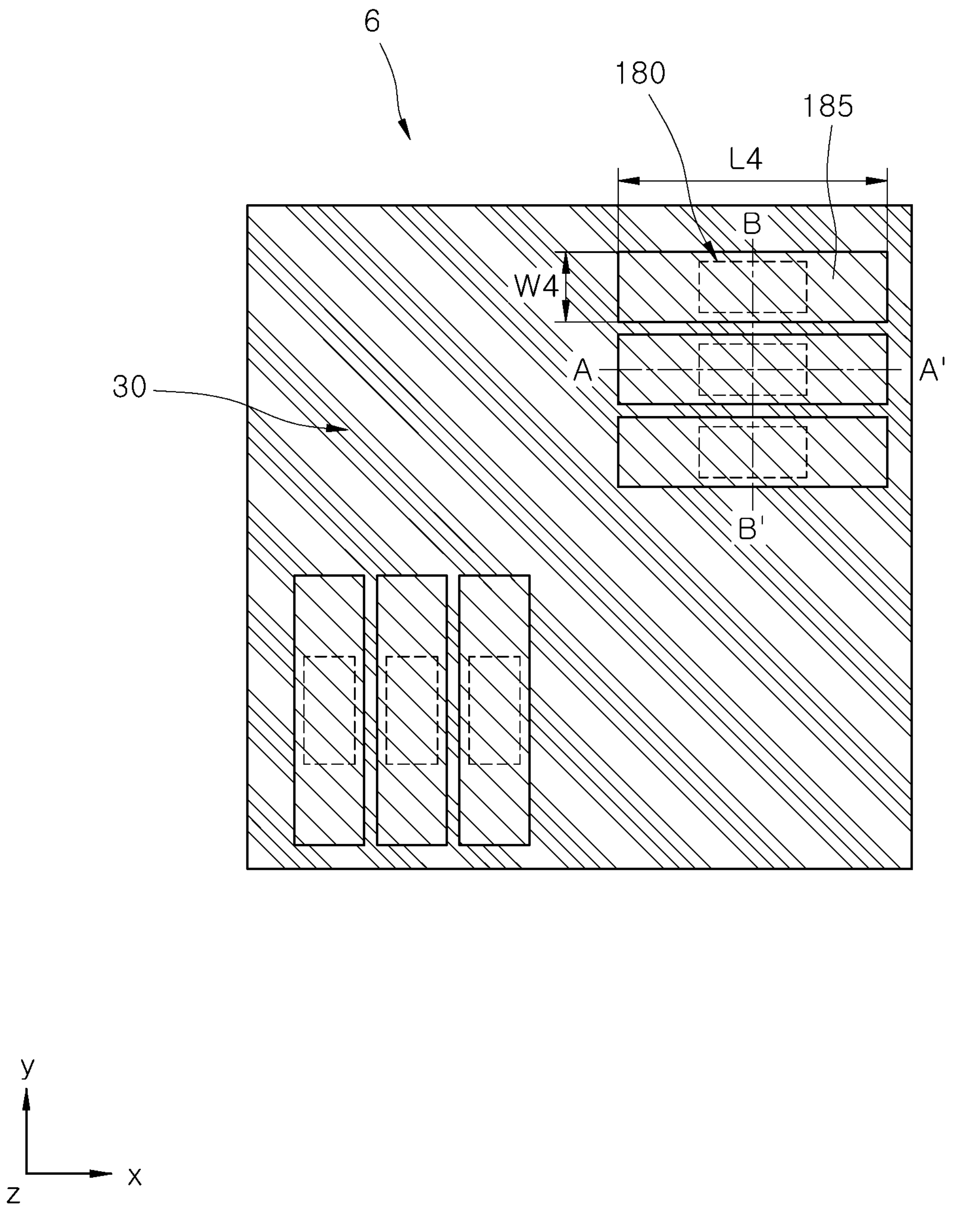
FIG. 7A is a plan view schematically illustrating a semiconductor wafer including an alignment key structure, a contact pattern layer, and a connection pattern layer according to another embodiment of the present disclosure.
Figure 7B:
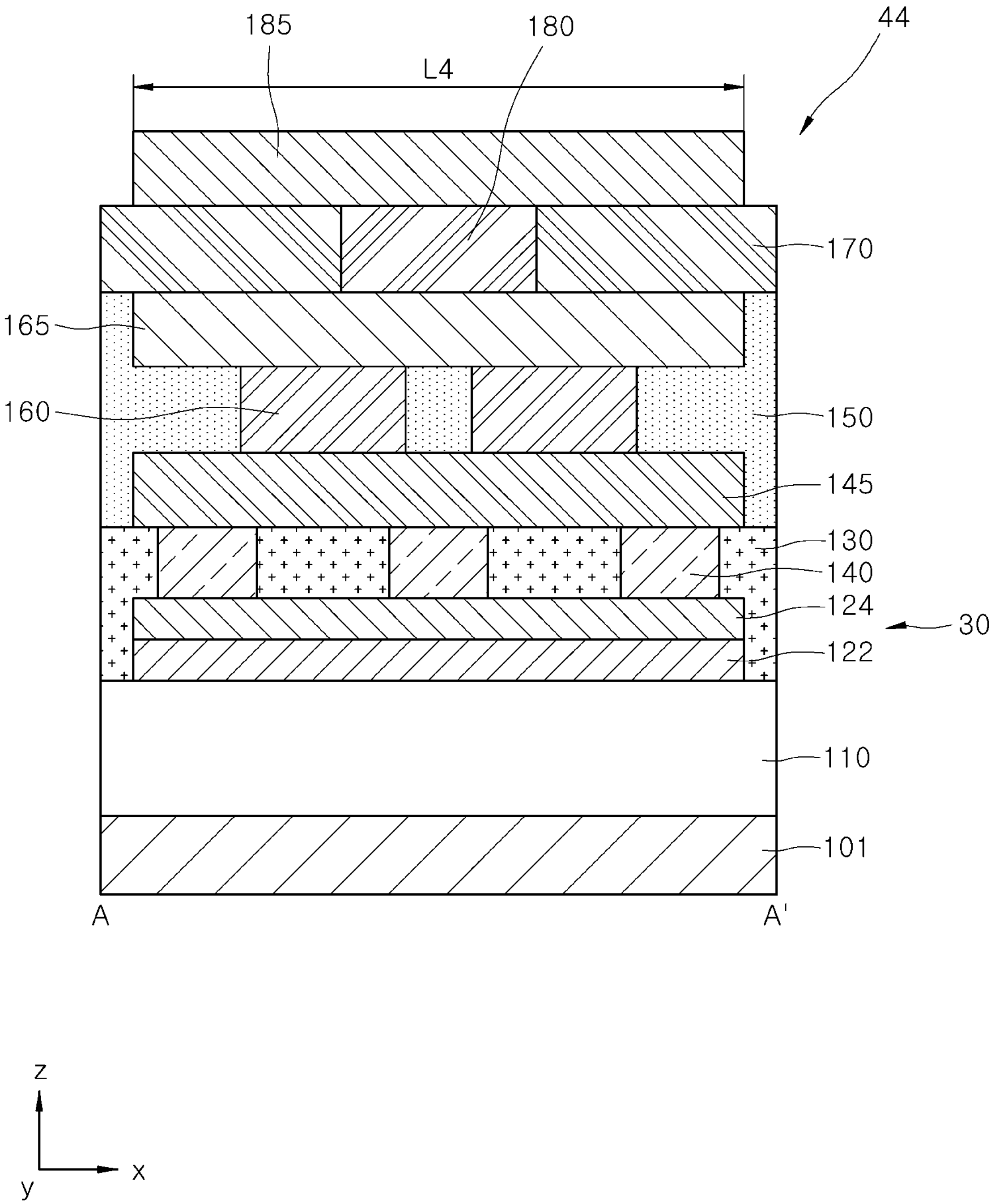
FIG. 7B is a cross-sectional view of the semiconductor wafer of FIG. 7A taken along line A-A'.
Figure 7C:
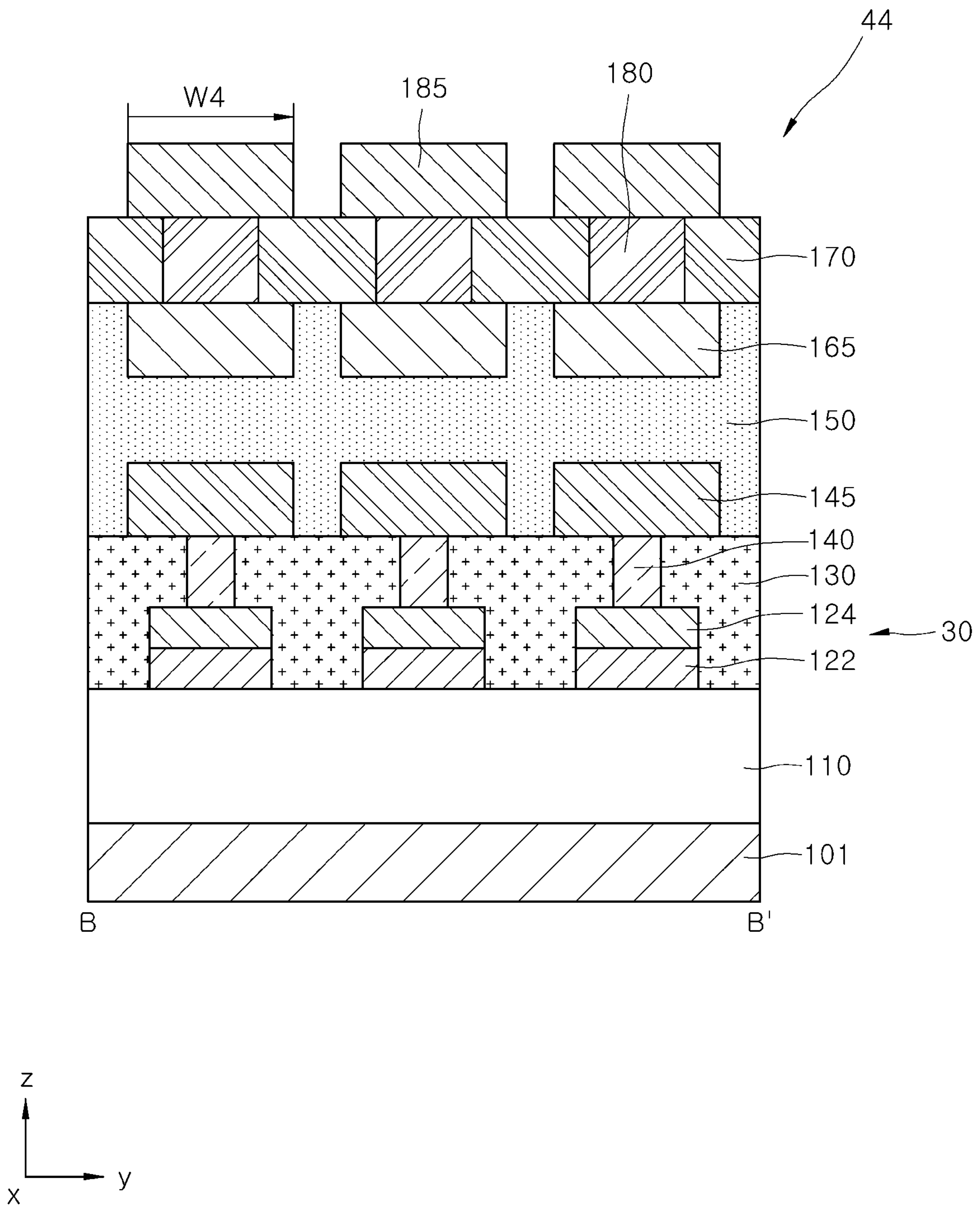
FIG. 7C is a cross-sectional view of the semiconductor wafer of FIG. 7A taken along line B-B'.

FIG. 7A is a plan view schematically illustrating a semiconductor wafer 6 including an alignment key structure, contact pattern layers, and connection pattern layers according to another embodiment of the present disclosure. FIG. 7B is a cross-sectional view of the semiconductor wafer of FIG. 7A taken along line A-A'. FIG. 7C is a cross-sectional view of the semiconductor wafer of FIG. 7A taken along line B-B'.

Referring to FIGS. 7A to 7C, compared to the semiconductor wafer 5 of FIGS. 6A to 6C, the semiconductor wafer 6 may further include a connection pattern layer 185 disposed on upper surfaces of a third contact pattern layer 180 and a third insulating layer 170 to cover the third contact pattern layer 180. Hereinafter, the connection pattern layer 185 covering the third contact pattern layer 180 is referred to as a third connection pattern layer 185.

In an embodiment, the third connection pattern layer 185 may overlap with at least a portion of a second connection pattern layer 165 in the third direction (e.g., z-direction. In an embodiment, referring to FIGS. 7A and 7B together, the third connection pattern layer 185 may have a length L4 and a width W4. In this case, the third connection pattern layer 185 and the second connection pattern layer 165 may overlap with each other.

In an embodiment, a process of forming the third connection pattern layer 185 may be performed by forming a metal layer on the third insulating layer 170 and the third contact pattern layer 180 and selectively etching the metal layer to form a metal pattern layer.

In an embodiment, when the third connection pattern layer 185 is an uppermost metal layer in a semiconductor integration process, the third connection pattern layer 185 may be made of a material different from that of the third contact pattern layer 180. As an example, the third contact pattern layer 180 may include copper (Cu), and the third connection pattern layer 185 may include aluminum (Al). This may be because the uppermost metal layer is applied to a test pad contacted by a probe during an electrical test of a semiconductor chip, and therefore, the metal of the uppermost metal layer requires better ductility than copper (Cu).

As described above, in an embodiment of the present disclosure, the semiconductor wafer 6 may include a stress alleviation structure 44 disposed over the alignment key structure 30. The stress alleviation structure 44 may include the first to third contact pattern layers 140, 160, and 180 and the first to third connection pattern layers 145, 165, and 185. The first to third contact pattern layers 140, 160, and 180 and the first to third connection pattern layers 145, 165, and 185 may alleviate the stress generated in the first to third insulating layers 130, 150, and 170 due to a thermal deformation difference.

Figure 8A:
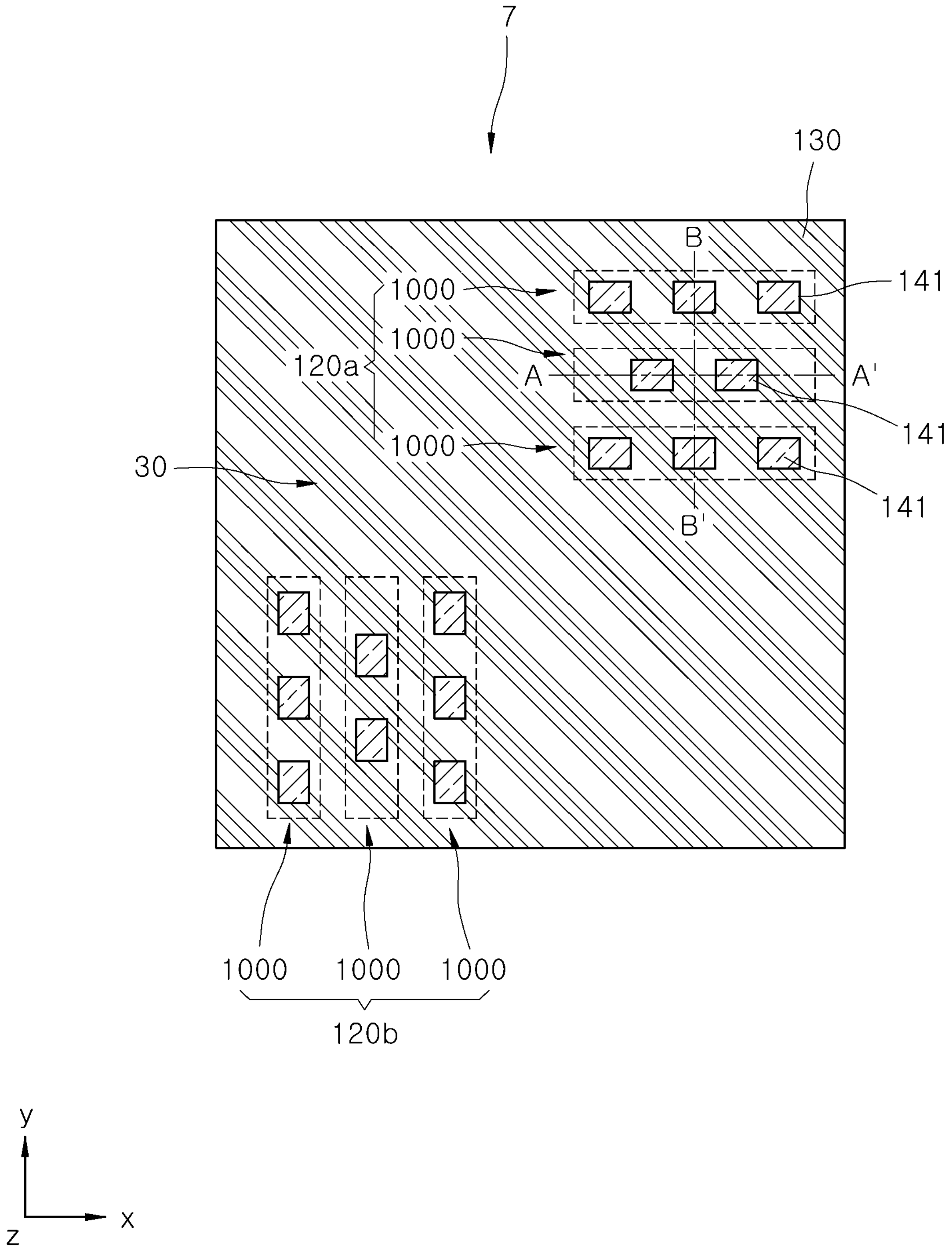
FIG. 8A is a plan view schematically illustrating a semiconductor wafer including an alignment key structure and a contact pattern layer according to another embodiment of the present disclosure.
Figure 8B:
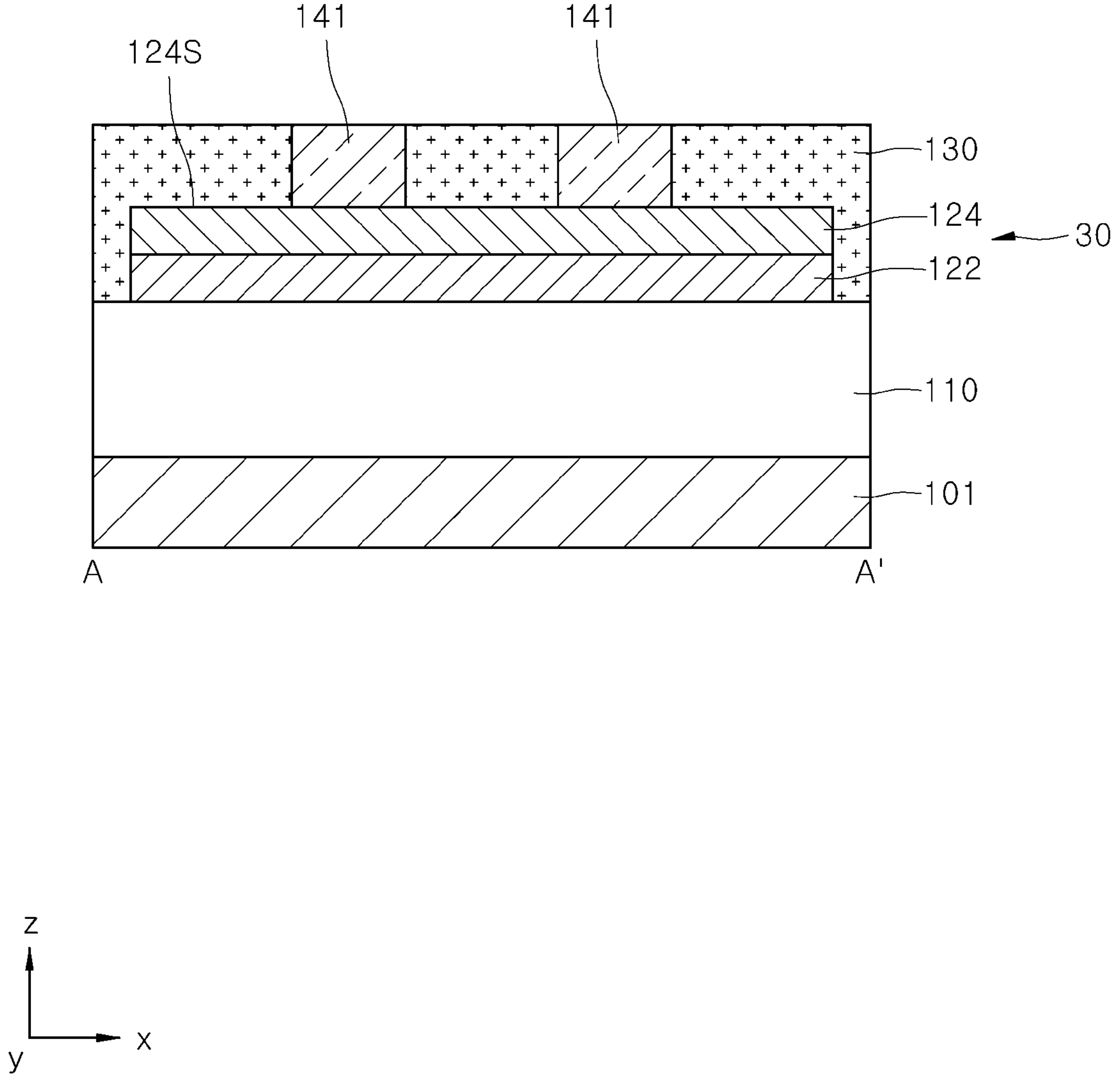
FIG. 8B is a cross-sectional view of the semiconductor wafer of FIG. 8A taken along line A-A'.
Figure 8C:
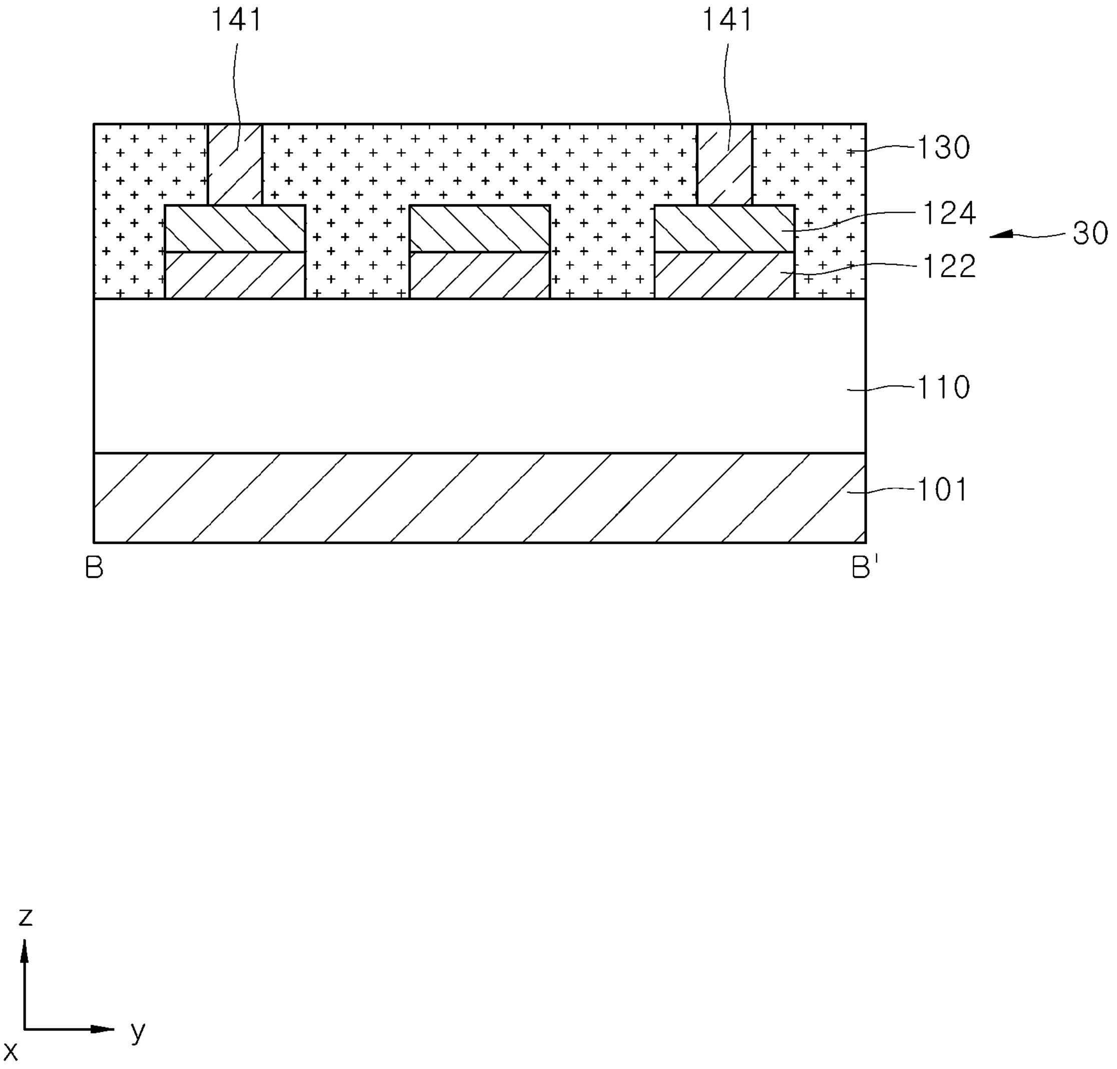
FIG. 8C is a cross-sectional view of the semiconductor wafer of FIG. 8A taken along line B-B'.

FIG. 8A is a plan view schematically illustrating a semiconductor wafer 7 including an alignment key structure and a contact pattern layer according to another embodiment of the present disclosure. FIG. 8B is a cross-sectional view of the semiconductor wafer of FIG. 8A taken along line A-A'. FIG. 8C is a cross-sectional view of the semiconductor wafer of FIG. 8A taken along line B-B'.

Referring to FIGS. 8A to 8C, compared to the semiconductor wafer 2 described with reference to FIGS. 3A to 3C, the semiconductor wafer 7 may be different from the semiconductor wafer 2 in the arrangement of the contact pattern layer 141.

Referring to FIGS. 8A to 8C, the contact pattern layer 141 may include pillar structures disposed on an upper surface 124S of each of the plurality of unit key patterns 1000. Each of the pillar structures may have a shape of a square pillar, but is not necessarily limited thereto, and the pillar structure may have a shape of a cylinder, an elliptical pillar, or various polygonal pillars.

In an embodiment, on each of the unit key patterns 1000 of a first alignment key pattern layer 120*a*, the pillar structures may be arranged in the first direction (e.g., x-direction). As another example, on each of the unit key patterns 1000 of a second alignment key pattern layer 120*b*, the pillar structures may be arranged in the second direction (e.g., y-direction).

In an embodiment, the pillar structures may be arranged alternately with each other between neighboring key layers 1000, that is, in a zigzag form. As an example, the pillar structures disposed on one unit key pattern among the plurality of unit key patterns 1000 of the first alignment key pattern layer 120*a* may be arranged alternately with the pillar structures disposed on the neighboring unit key pattern 1000 in the second direction (e.g., y-direction). As another example, the pillar structures disposed on one unit key pattern among the plurality of unit key patterns 1000 of the second alignment key pattern layer 120*b* may be arranged alternately with the pillar structures disposed on the neighboring unit key pattern 1000 in the first direction (e.g., x-direction).

Figure 9A:
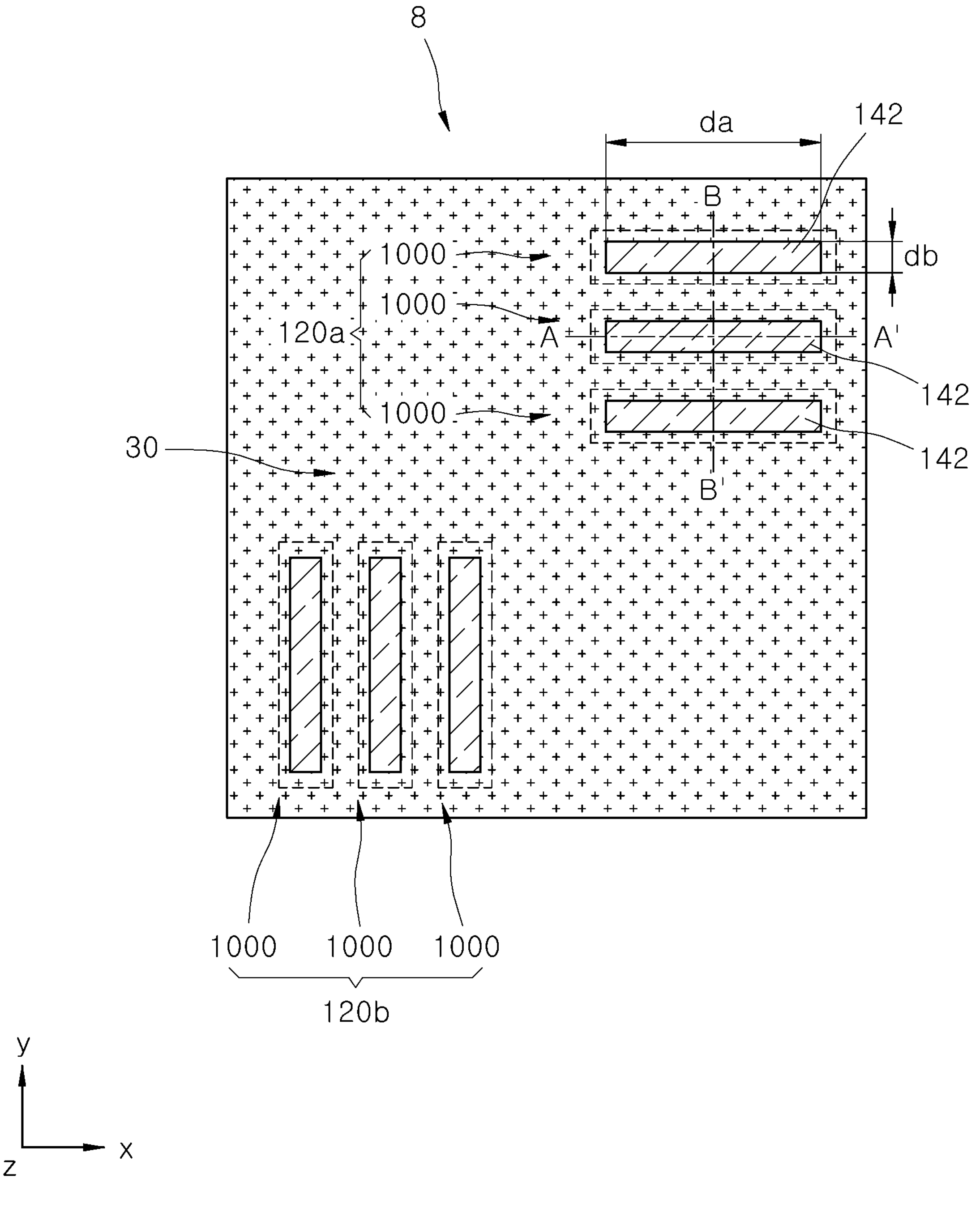
FIG. 9A is a plan view schematically illustrating a semiconductor wafer including an alignment key structure and a contact pattern layer according to another embodiment of the present disclosure.
Figure 9B:
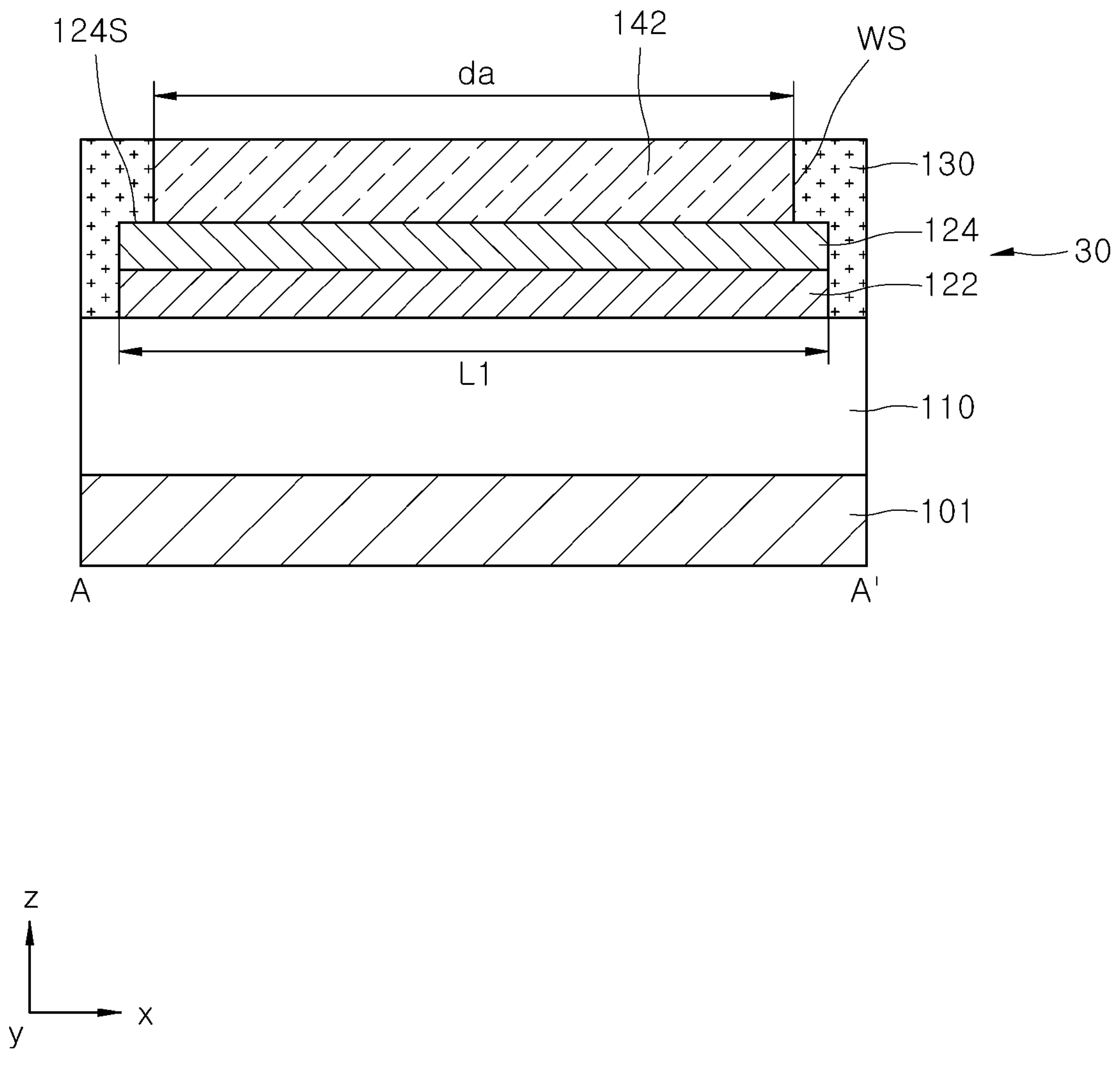
FIG. 9B is a cross-sectional view of the semiconductor wafer of FIG. 9A taken along line A-A'.
Figure 9C:
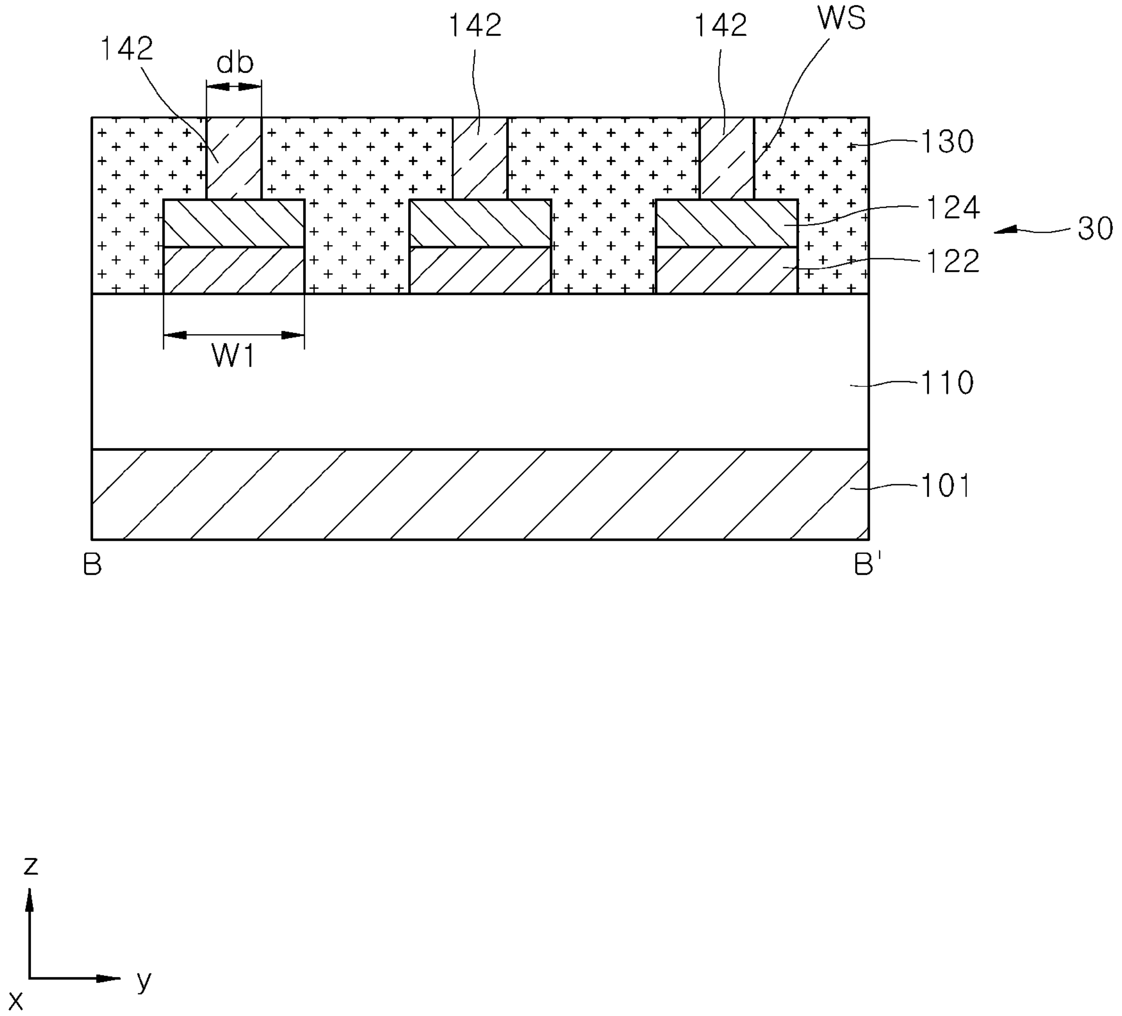
FIG. 9C is a cross-sectional view of the semiconductor wafer of FIG. 9A taken along line B-B'.

FIG. 9A is a plan view schematically illustrating a semiconductor wafer 8 including an alignment key structure and a contact pattern layer according to another embodiment of the present disclosure. FIG. 9B is a cross-sectional view of the semiconductor wafer of FIG. 9A taken along line A-A'. FIG. 9C is a cross-sectional view of the semiconductor wafer of FIG. 9A taken along line B-B'.

Referring to FIGS. 9A to 9C, compared to the semiconductor wafer 2 described with reference to FIGS. 3A to 3C, the semiconductor wafer 8 may be different from the semiconductor wafer 2 in the arrangement of the contact pattern layer 142.

Referring to FIG. 9A, the contact pattern layer 142 may include a wall structure WS disposed on upper surfaces 124S of the plurality of unit key patterns 1000. In an embodiment, on each of the plurality of unit key patterns 1000 of the first alignment key pattern layer 120*a*, the wall structure WS may extend in the first direction (e.g., x-direction). In this case, the wall structure WS may be arranged to overlap with each other in the second direction (e.g., y-direction) on the plurality of unit key patterns 1000. As another example, on each of the plurality of unit key patterns 1000 of the second alignment key pattern layer 120*b*, the wall structure WS may extend in the second direction (e.g., y-direction). In this case, the wall structure WS may be arranged to overlap with each other in the first direction (e.g., x-direction) on the plurality of unit key patterns 1000.

In an embodiment, each of the wall structure WS may have a length da and a width db. The length da and width db of the wall structure WS may be smaller than the length L1 and width W1 of the unit key pattern 1000, respectively.

Figure 10A:
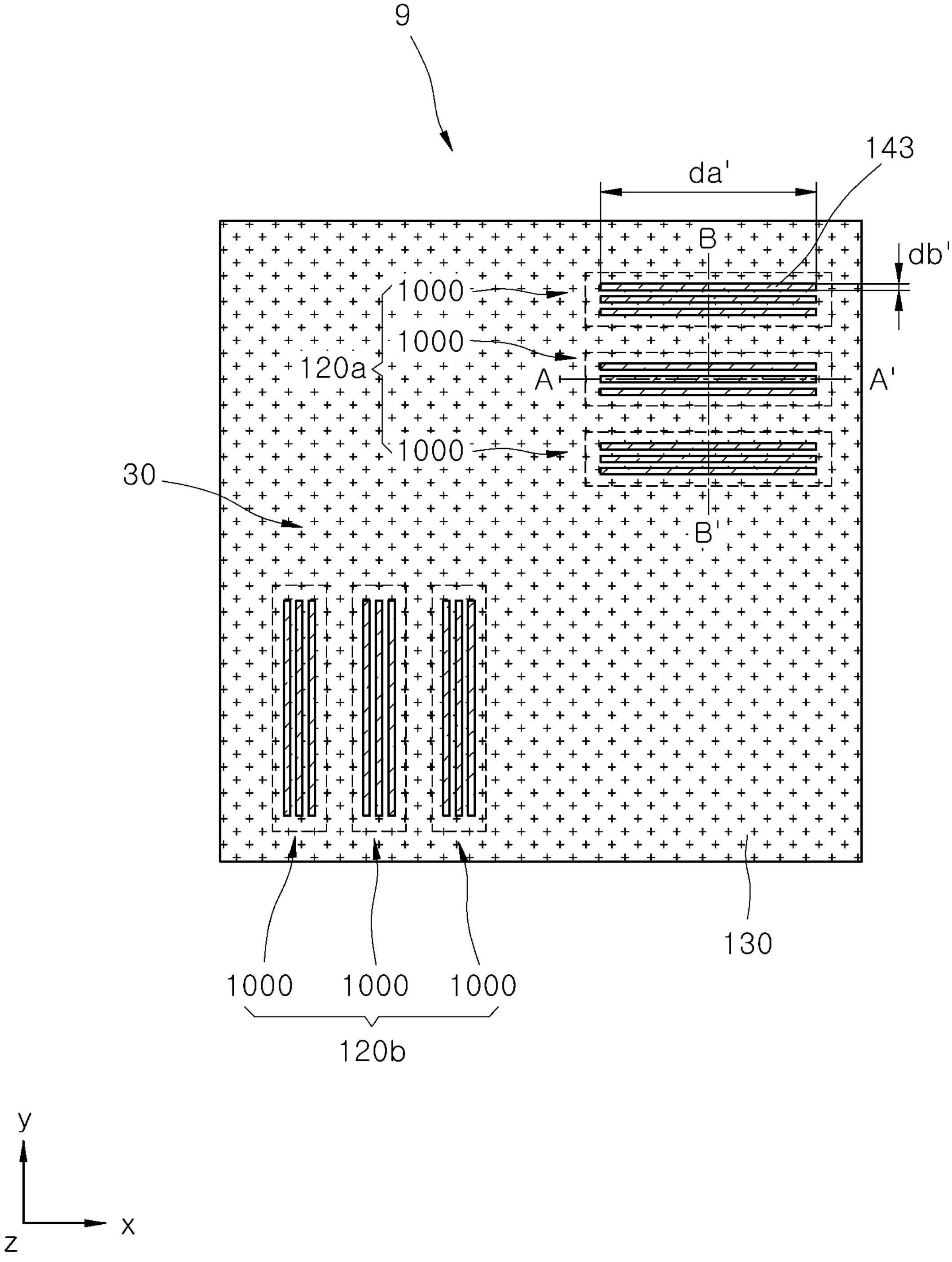
FIG. 10A is a plan view schematically illustrating a semiconductor wafer including an alignment key structure and a contact pattern layer according to another embodiment of the present disclosure.
Figure 10B:
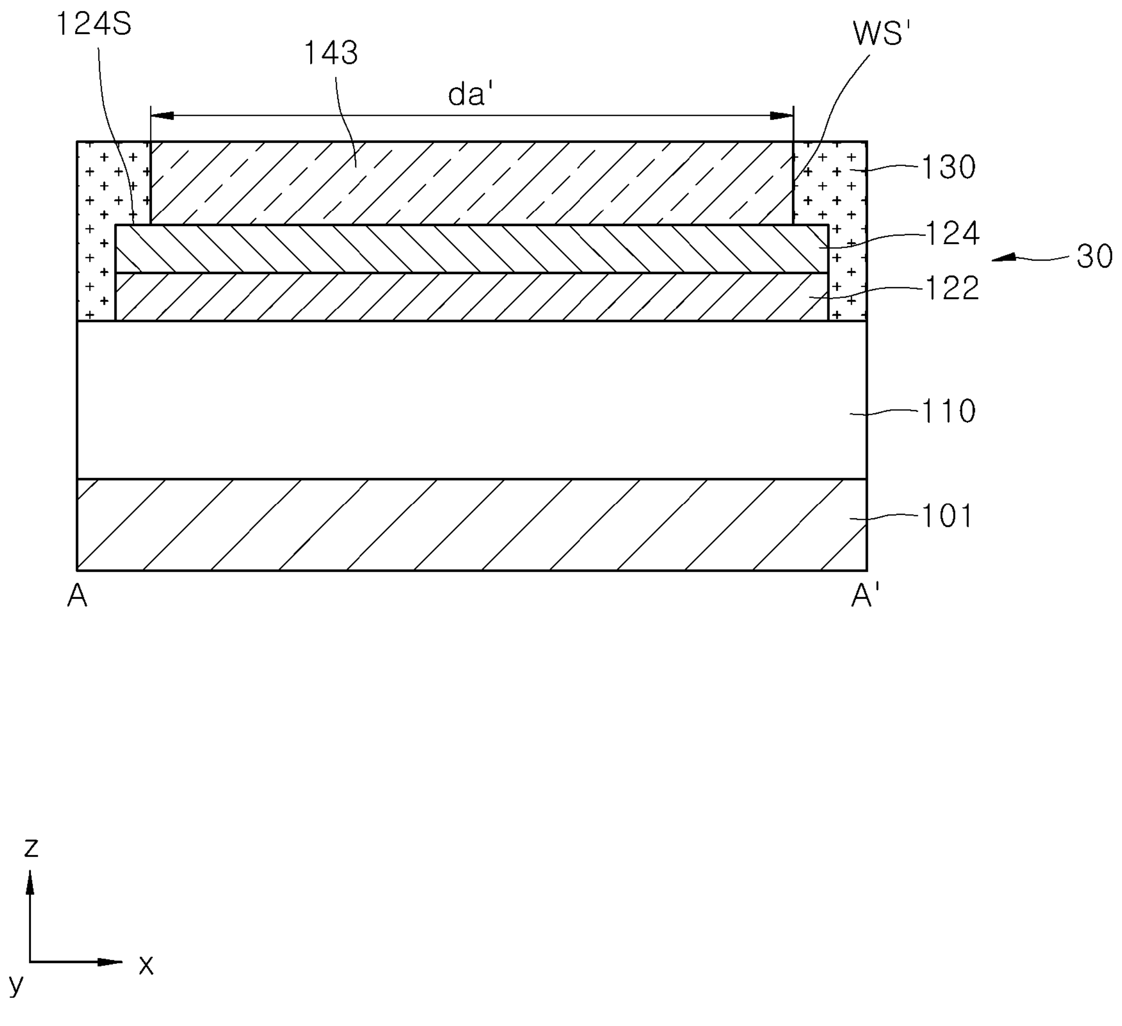
FIG. 10B is a cross-sectional view of the semiconductor wafer of FIG. 10A taken along line A-A'.
Figure 10C:
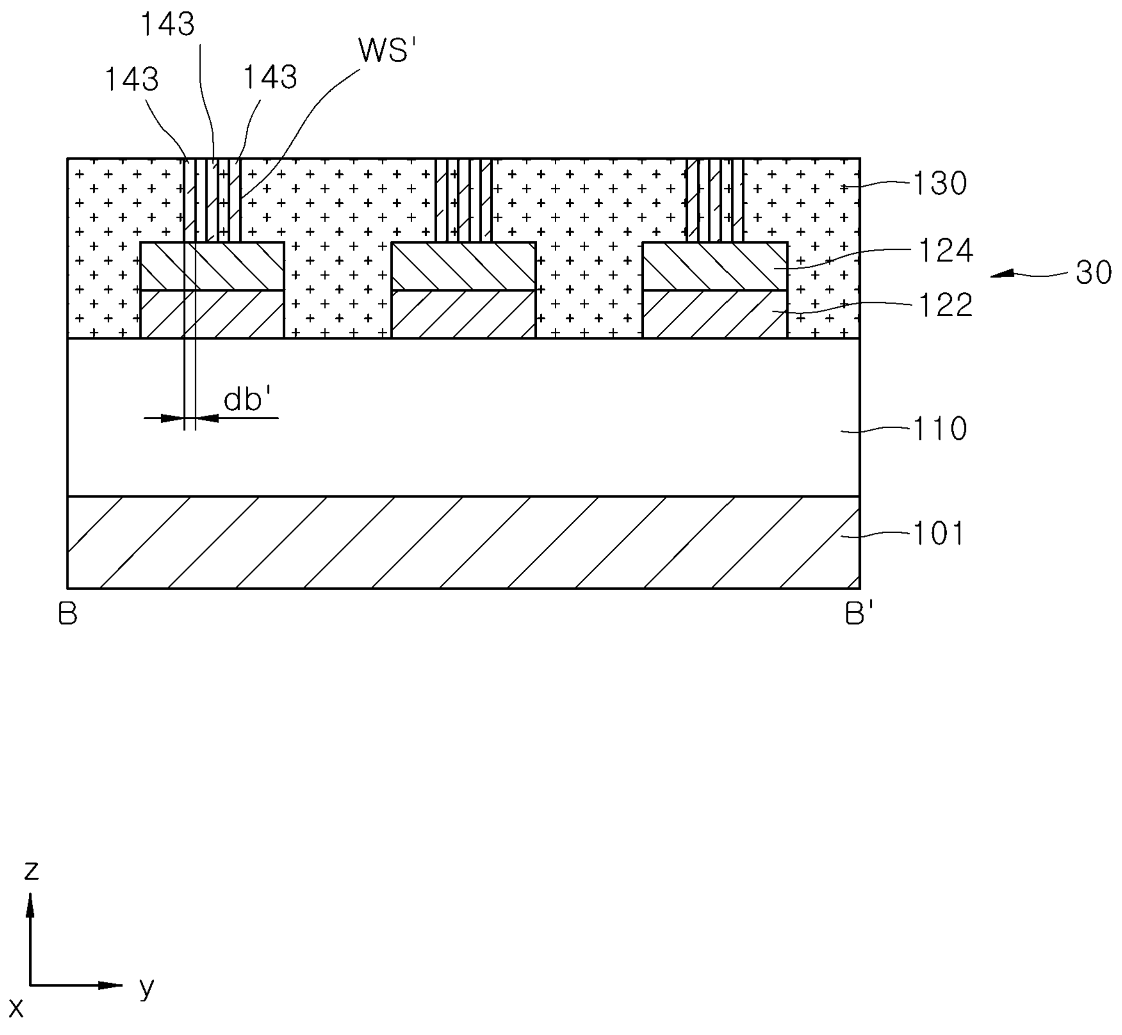
FIG. 10C is a cross-sectional view of the semiconductor wafer of FIG. 10A taken along the line B-B'.

FIG. 10A is a plan view schematically illustrating a semiconductor wafer 9 including an alignment key structure and a contact pattern layer according to another embodiment of the present disclosure. FIG. 10B is a cross-sectional view of the semiconductor wafer of FIG. 10A taken along line A-A'. FIG. 10C is a cross-sectional view of the semiconductor wafer of FIG. 10A taken along line B-B'.

Referring to FIGS. 10A to 10C, compared to the semiconductor wafer 8 described with reference to FIGS. 9A to 9C, the semiconductor wafer 9 may be different from the semiconductor wafer 8 in the arrangement of the contact pattern layer 143.

Referring to FIG. 10A, the contact pattern layer 143 may include a plurality of wall structures WS' disposed on an upper surface 124S of each of a plurality of unit key patterns 1000. Each of the plurality of wall structures WS' may have a length da' and a width db'. In FIG. 10A, the plurality of wall structures WS' may be spaced apart from each other on each of the unit key patterns 1000.

In an embodiment, the plurality of wall structures WS' may extend in the first direction (e.g., x-direction) on each of the unit key pattern 1000 of the first alignment key pattern layer 120*a*. In this case, the plurality of wall structures WS' may be arranged to overlap with each other in the second direction (e.g., y-direction) on each of the unit key pattern 1000. As another example, the plurality of wall structures WS' may extend in the second direction (e.g., y-direction) on each of the unit key pattern 1000 of a second alignment key pattern layer 120*b*. In this case, the plurality of wall structures WS' may be arranged to overlap with each other in the first direction (e.g., x-direction) on each of the unit key pattern 1000.

As described above, according to an embodiment of the present disclosure, a semiconductor wafer may include a contact pattern layer disposed to extend upward of an alignment key structure over the alignment key structure. The contact pattern layer may alleviate the stress generated in an insulating layer in contact with the alignment key structure. According to a simulation result, in a case where the contact pattern layer is disposed over the alignment key structure, the stress inside the insulating layer may be alleviated by up to 54%, compared to a case where the contact pattern layer is not disposed.

In addition, according to an embodiment, the semiconductor wafer may include the connection pattern layer disposed on the alignment key structure to cover the contact pattern layer. The connection pattern layer may be disposed to be connected to the contact pattern layer, so that the stress inside the insulating layer may be further alleviated.

As described above, according to an embodiment, by applying a stress alleviation structure including the contact pattern layer or a combination of the contact pattern layer and the connection pattern layer over the alignment key structure, it is possible to provide a semiconductor wafer in which structural stability between the alignment key structure and the insulating layer is improved.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor wafer comprising:

an alignment key structure including a unit key pattern having a rectangular planar shape disposed over a substrate;

a contact pattern layer disposed on the unit key pattern, the contact pattern layer extending upward of the unit key pattern;

an insulating layer in contact with the alignment key structure and the contact pattern layer over the substrate; and a connection pattern layer having a rectangular planar shape disposed over the alignment key structure, the connection pattern layer covering the contact pattern layer and the unit key pattern, wherein a length of the connection pattern layer is larger than a length of the unit key pattern, and a width of the connection pattern layer is larger than a width of the unit key pattern.

2. The semiconductor wafer of claim 1, wherein the alignment key structure is disposed in a scribe lane region located between a plurality of chip regions of the substrate.

3. The semiconductor wafer of claim 1, wherein the alignment key structure includes a plurality of unit key patterns disposed over the substrate, and wherein the plurality of unit key patterns are disposed to extend in a first direction that is substantially parallel to a surface of the substrate.

4. The semiconductor wafer of claim 3, wherein the plurality of unit key patterns are arranged in a second direction that is substantially perpendicular to the first direction.

5. The semiconductor wafer of claim 4, wherein each of the plurality of unit key patterns has a length along the first direction and a width along the second direction, and wherein the length is greater than the width.

6. The semiconductor wafer of claim 3, wherein the contact pattern layer includes pillar structures arranged in the first direction on an upper surface of each of the plurality of unit key patterns.

7. The semiconductor wafer of claim 1, wherein the alignment key structure includes a nitride of a first metal, wherein the contact pattern layer includes the first metal, wherein the connection pattern layer includes a second metal different from the first metal, and wherein the insulating layer includes an oxide.

8. The semiconductor wafer of claim 1, wherein the alignment key structure includes a plurality of unit key patterns disposed over the substrate and extending in the first direction, and wherein the connection pattern layer is disposed to correspond to each of the plurality of unit key patterns.

9. The semiconductor wafer of claim 8, wherein the contact pattern layer includes a pillar structure or a wall structure respectively connecting the plurality of unit key patterns to the connection pattern layer.

10. A semiconductor wafer comprising:

an alignment key structure including a unit key pattern having a rectangular planar shape disposed over a substrate; and a stress alleviation structure disposed over the alignment key structure, wherein the stress alleviation structure includes:

a contact pattern layer disposed on unit key pattern, the contact pattern layer extending upward of the unit key pattern; and a connection pattern layer having a rectangular planar shape disposed over the alignment key structure, the connection pattern layer covering the contact pattern layer and the unit key pattern, wherein a length of the connection pattern layer is larger than a length of the unit key pattern, and a width of the connection pattern layer is larger than a width of the unit key pattern.

11. The semiconductor wafer of claim 10, wherein the alignment key structure includes nitride of first metal, wherein the contact pattern layer includes the first metal, and wherein the connection pattern layer includes second metal different from the first metal.

12. The semiconductor wafer of claim 10, wherein the alignment key structure includes a plurality of unit key patterns, and wherein the plurality of unit key patterns are disposed to extend in a first direction that is substantially parallel to a surface of the substrate.

13. The semiconductor wafer of claim 12, wherein the contact pattern layer includes pillar structures arranged in the first direction on each of the plurality of unit key patterns.

14. The semiconductor wafer of claim 12, wherein the connection pattern layer is disposed to correspond to each of the plurality of unit key patterns.

* * * * *